US009217063B2

(12) United States Patent
Hsu et al.

(10) Patent No.: US 9,217,063 B2
(45) Date of Patent: Dec. 22, 2015

(54) CONJUGATED POLYMER COMPOUND

(71) Applicant: NATIONAL CHIAO TUNG UNIVERSITY, Hsinchu (TW)

(72) Inventors: Chain-Shu Hsu, Hsinchu (TW); Ching-Yao Lin, Hsinchu (TW); Chien-Lung Wang, Hsinchu (TW); Jhong-Sian Wu, Hsinchu (TW); Yi-Hsiang Chao, Hsinchu (TW); Jyun-Fong Jheng, Hsinchu (TW); Ming-Chi Tsai, Hsinchu (TW); Chin-Li Wang, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 14/502,879

(22) Filed: Sep. 30, 2014

(65) Prior Publication Data
US 2015/0133617 A1 May 14, 2015

(30) Foreign Application Priority Data
Nov. 14, 2013 (TW) .............................. 102141537 A

(51) Int. Cl.
*C08G 65/38* (2006.01)
*C08G 75/00* (2006.01)

(52) U.S. Cl.
CPC ..................................... *C08G 75/00* (2013.01)

(58) Field of Classification Search
CPC ............... C08G 75/00; C08G 2261/91; H01L 51/0047; Y02E 10/549
See application file for complete search history.

(56) References Cited

U.S. PATENT DOCUMENTS

2007/0295398 A1  12/2007 On Too et al.
2009/0023842 A1*  1/2009 Laird et al. ...................... 524/90

FOREIGN PATENT DOCUMENTS

CN  102344549 A  2/2012

OTHER PUBLICATIONS

Schaeferling et al. (J . Ma t e r . C h em., 2 0 0 4, 1 4, 1 1 3 2-1 1 4 1 ).*
Office Action was issued on Jan. 13, 2015 from Taiwan Patent Office.
Beatriz Peladoa, Pilar de la Curuza, Victoria Gonzalez-Pedrob, Eva M. Bareab, Fernando Langaa, Effect of the bridge substitution on the efficiency of dye-sensitized cells, Tetrahedron Letters, vol. 53, Issue 49, Dec. 5, 2012, pp. 6665-6669, Full Text.
Michael Schaferling and Peter Bauerle, Porphyrin-functionalized oligo and polythiophenes, J. Mater. Chem, 2004, 14, 1132-1141, Process 1 of p. 1135.
Na Xinanga, Yijiang Liva, Weiping Zhoua, Hui Huanga, Xia Guoa, Zhuo Tana, Bin Zhaoa, Ping Shena, Songting Tan, Synthesis and characterization of porphyrin-terthiophene and oligothiophene π-conjugated copolymers for polymer solar cells, European Polymer Journal, vol. 46, Issue 5, May 2010, pp. 1084-1092, Full Text.
Guangtao Li, Tianyu Wang, Adrea Schulz, Sheshanath Bhosale, Matthias Lauer, Pamela Espindola, Jurgen Heinzeb and Jurgen-Hinrich Fuhrhop, Porphyrin-acetylene-thiophene polymer wires, Chem. commun., 2004, 552-553, Full Text.

\* cited by examiner

*Primary Examiner* — Shane Fang
(74) *Attorney, Agent, or Firm* — The PL Law Group, PLLC

(57) ABSTRACT

A conjugated polymer compound is disclosed. The conjugated polymer compound includes a conjugated polymeric main chain; and a porphyrin compound having absorption in a blue light region of solar radiation, and is bonded to the polymeric main chain to form a side chain on the polymeric main chain.

15 Claims, 7 Drawing Sheets

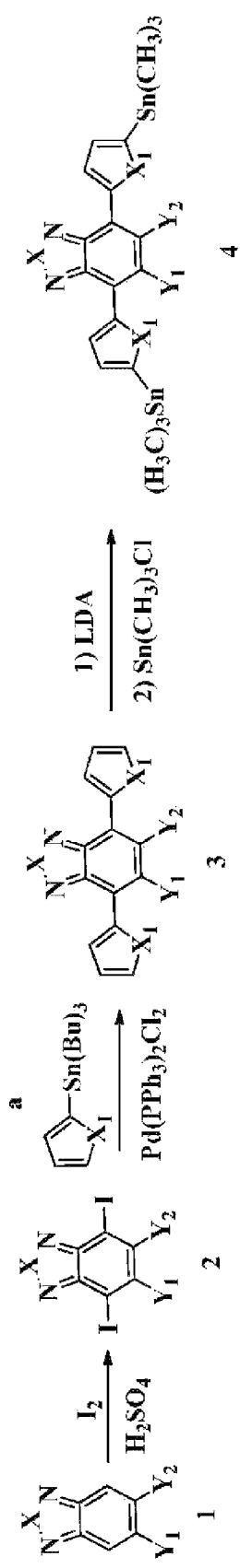
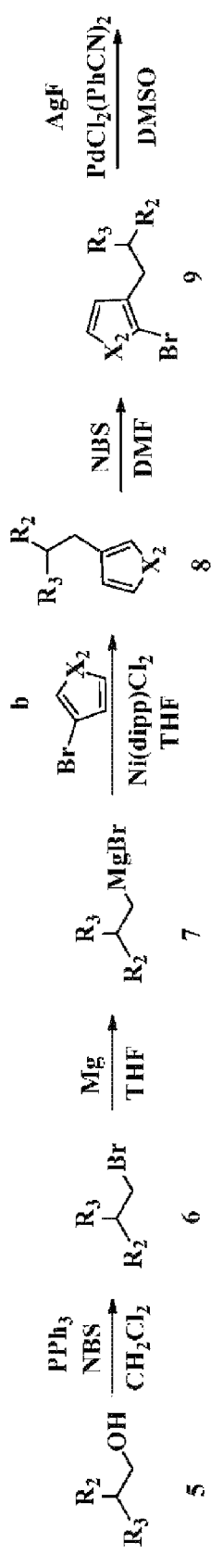
Fig. 1(a)
Fig. 1(b)

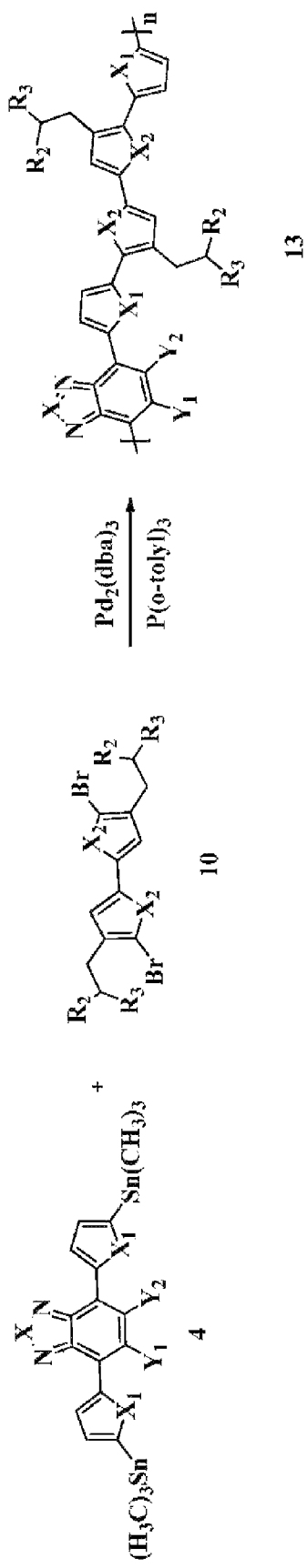
Fig. 1(c)
Fig. 1(d)
Fig. 1(e)

CONJUGATED POLYMER COMPOUND

CROSS-REFERENCE TO RELATED APPLICATION AND CLAIM OF PRIORITY

This application claims the benefit of Taiwan Patent Application No. 102141537, filed on Nov. 14, 2013, at the Taiwan Intellectual Property Office, the disclosures of which are incorporated herein in their entirety by reference.

FIELD OF THE INVENTION

The present invention relates to a polymer. In particular, the present invention relates to a conjugated polymer compound.

BACKGROUND OF THE INVENTION

The solar cells currently available in the market, based on which kind of material is used, include crystalline silicon, a compound and organic types of solar cells. In comparison with the others, the manufacture of organic solar cells is relatively simple and the manufacturing cost is inexpensive. Organic solar cells can be additionally categorized into dye-sensitized solar cells and organic thin film solar cells according to their different device structures. The organic material generally used in organic thin film solar cells has a light absorption coefficient of about $10^5 \, mol^{-1} \, cm^{-1}$. This excellent property of light absorption means that organic thin film solar cells can deal with the sunlight much more efficiently. However, the organic solar cells presently developed are poor in their power conversion efficiency (PCE) and have short cell lives, and so the commercial value of utilizing the organic solar cells is reduced.

Accordingly, to improve the power conversion efficiency of polymer solar cells (PSCs) and to reduce the manufacturing costs for commercial purposes, solar cells should possess at least the following properties: (1) a high absorption capacity and a broad absorption band compared to sunlight; (2) high charge mobility; (3) a low energy level of the highest occupied molecular orbital (EHOMO); and (4) good solubility. A polymer solar cell having good properties (1)-(3) is able to achieve the performance of a high short-circuit current, a high open-circuit voltage and high power conversion efficiency, and property (4) enables the possibility to produce solar cells at a lower cost by using a wet process assisted by a solvent and to manufacture solar cell products on a substrate having a large area.

The solubility in a solvent and the solid structure of a conjugated polymer compound can be improved by (1) modifying the main chain structure to improve the absorption capability to the spectrum of sunlight, improve the carrier mobility and modulate the energy level of a molecular orbital; and (2) modifying the alkyl group on a side chain of the main chain. The conjugated polymer used in the past, such as poly(3-hexylthiophene), has poor collection capacity for photons of sunlight in the red light region and near infrared light region, for which the wavelength in sunlight is between 600 nm and 900 nm, so the absorption efficiency is hard to improve. A design to use a polymer having a low bandgap can shift the absorption band of the material to the wavelength in the region from 600 nm to 900 nm to overcome the problem mentioned above, however, some new problems have arisen. The new problems include poor absorption of wavelengths between 400 nm and 600 nm, meaning that the light in short and medium wavelengths between 400 nm and 600 nm, which has a higher energy, cannot be effectively utilized. In addition, light in longer wavelength regions, higher than 900 nm, cannot be effectively utilized either.

A porphyrin compound can effectively absorb sunlight in the short wavelength region, making it an ideal functional unit to improve the absorption of a conjugated polymer for sunlight. It can be observed in the prior art that the introduction of a porphyrin compound to a polymer material having a lower bandgap or to a traditional conjugated polymer will cause deterioration to the performance of the solar cell. The reason is that the porphyrin compound is a bulky cyclic molecule, and the bulky molecule destroys the conjugation structure of the main chain in the conjugated polymer, so the absorption in the red light region, with a wavelength between 600 nm and 900 nm, is reduced, and the current collected by the solar cell is relatively low. Furthermore, the introduction of the porphyrin compound will vary the solid stacking of the conjugated polymer, influence the morphology of the active layer in the solar cell, and result in a decrease in the fill factor (FF) of the solar cell. Due to the reasons above, both the power conversion efficiency and the stability of the polymer solar cell containing the porphyrin compound are quite low. Accordingly, a polymer material with the absorption in the ranges close to the full spectrum of sunlight with high efficiency and a light-sensitized material containing the porphyrin compound have not yet been applicable to polymer solar cells.

In order to overcome the drawbacks in the prior art, a conjugated polymer compound is disclosed. The particular design in the present invention not only solves the problems described above, but is also easy to implement. Thus, the present invention has utility for the industry.

SUMMARY OF THE INVENTION

In accordance with an aspect of the present invention, a conjugated polymer compound is disclosed. The conjugated polymer compound has one of the formula (1) and (2),

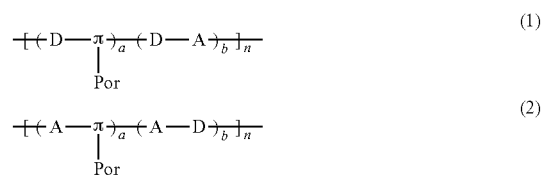

wherein π is selected from one of an unsaturated $C_{3-16}$ aromatic ring and an unsaturated $C_{3-16}$ heteroaromatic ring, the unsaturated $C_{3-16}$ heteroaromatic ring includes at least a heteroatom, and the heteroatom includes at least one selected from a group consisting of N, S, O, and Se.

In accordance with another aspect of the present invention, a conjugated polymer compound is disclosed. The conjugated polymer compound includes a conjugated polymeric main chain and a porphyrin compound having absorption in the blue light region of solar radiation, and is bonded to the polymeric main chain to form a side chain on the polymeric main chain.

In accordance with a further aspect of the present invention, a conjugated polymer compound is disclosed. The conjugated polymer compound includes a main chain and a side chain, wherein the side chain includes a porphyrin compound.

The objects and advantages of the present invention will become more readily apparent to those ordinarily skilled in the art after reviewing the following detailed descriptions and accompanying drawings, in which:

BRIEF DESCRIPTION OF THE DRAWINGS

FIG. 1(a) shows a synthetic reaction of a monomer according to an embodiment of the present invention;

FIG. 1(b) shows a synthetic reaction of another monomer according to another embodiment of the present invention;

FIG. 1(c) shows a synthetic reaction of a conjugated polymer according to an embodiment of the present invention;

FIGS. 1(d) and 1(e) are common structural formulas, each of which shows a conjugated polymer containing a porphyrin compound according to an embodiment of the present invention;

DETAILED DESCRIPTION OF THE PREFERRED EMBODIMENT

Figure 1F:
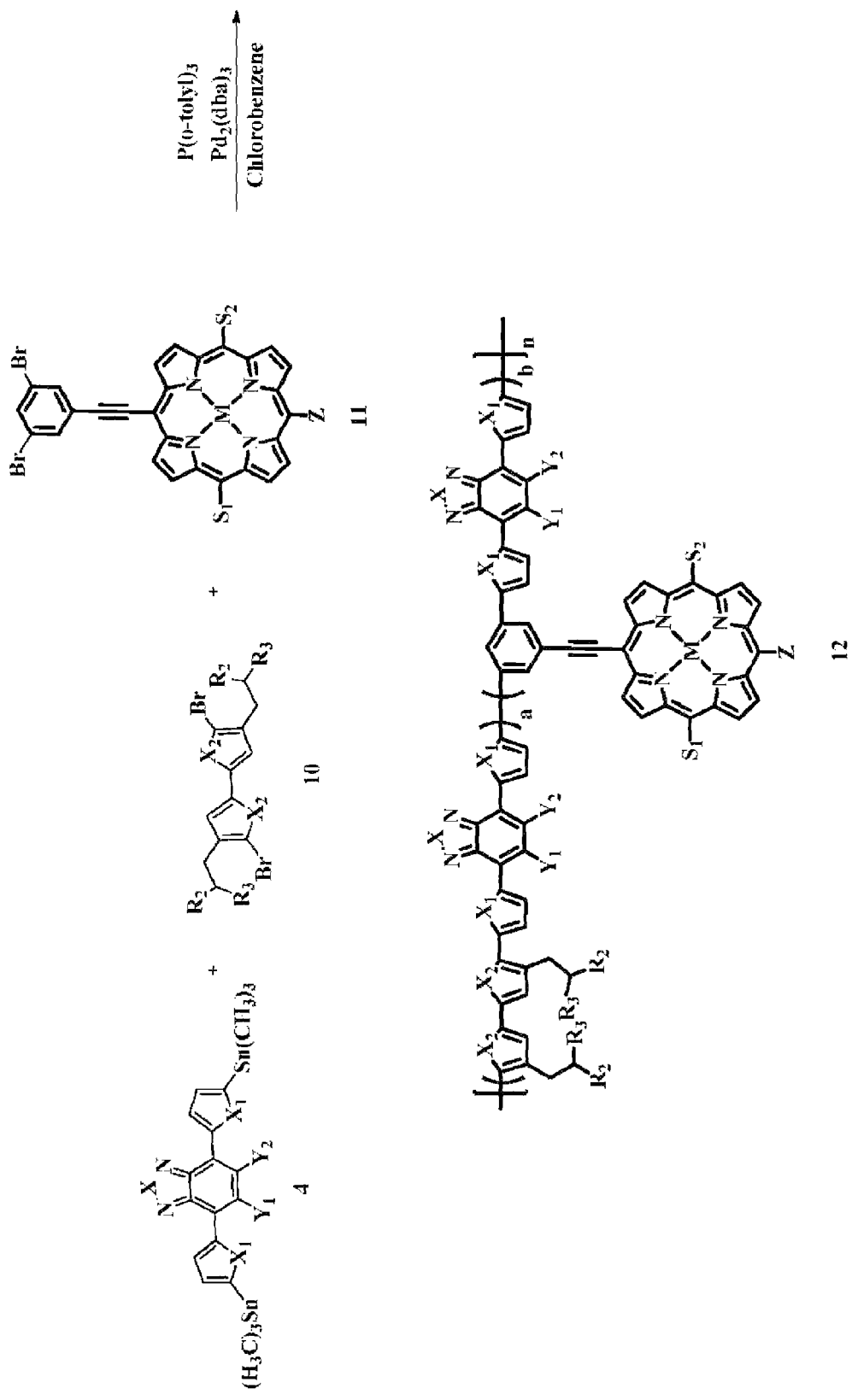
FIG. 1(f) shows a synthetic reaction of a conjugated polymer containing a porphyrin compound according to an embodiment of the present invention.

The present invention will now be described more specifically with reference to the following embodiments. It is to be noted that the following descriptions of the preferred embodiments of this invention are presented herein for the purposes of illustration and description only; they are not intended to be exhaustive or to be limited to the precise form disclosed.

The magnitude of the power conversion efficiency (PCE) of an organic solar cell (or "device" hereinafter) is determined by the parameters of an open-circuit voltage ($V_{oc}$), a short-circuit current ($J_{sc}$), and a fill factor (FF) of the device, as shown in [Equation 1]. According to the present research, it is known that the material and the morphology of the active layer are the main factors influencing the magnitude of the power conversion efficiency. Generally speaking, the active layer is composed of an electron donor and an electron acceptor, wherein the match and the selection of the electron donor and the electron acceptor are related to the highest occupied molecular orbital (HOMO) and the lowest unoccupied molecular orbital (LUMO) of the electron donor and the electron acceptor. This means that the materials used in the electron donor and the electron acceptor have significant influence on three characteristic factors: the adsorption region of the device, the dissociation of the exciton, and the open-circuit voltage of the device. In other words, these characteristic factors vary and are influenced by the materials and the morphology of the materials used for the active layer of the device. It is very important to select the materials for the electron donor and the electron acceptor, and to match the energy levels resulting from the selection of the materials of the electron donor and the electron acceptor.

$$PCE = P_{max}/P_{in} = FF \times J_{sc} \times V_{oc}/P_{in} \quad \text{[Equation 1]}$$

wherein $P_{max}$ is the maximum electric power that the device can output, and $P_{in}$ is the power of the incident light generated by a solar simulator.

The material of the electron donor is a p-type material and is composed of a porphyrin compound 11 and a plurality of monomers 4 and 10. As shown in FIG. 1 (f), the composition is a conjugated polymer 12 having a characteristic of a low bandgap. In addition, the electron acceptor is a N-type material which includes a fullerene derivative.

FIGS. 1(d) and 1(e) show the common structural formula of a conjugated polymer containing a porphyrin compound according to an embodiment of the present invention. Each of the common structural formulas constitutes a main chain and a side chain, wherein the main chain is composed of a compound of an electron-deficient group (also called an electron acceptor) A, a compound of an electron-rich group (also called an electron donor) D, and a compound of a π-aromatic bridge. The structure and properties of the main chain can vary by a different ratio of a and b. The parameter n is the number of repeated units. The side chain is a porphyrin compound.

The electron donor is composed of a porphyrin compound and a plurality of monomers D, A and π, wherein D and A respectively represent a compound having a plurality of donors D and a compound having a plurality of acceptors A, and π is an aromatic compound. The main chain of the polymer formed by the plurality of monomers is an electron accepting/donating system. The design of the electron accepting/donating system is performed by the hybridization of the HOMO and LUMO of the donor D and the acceptor A to generate a conjugated polymer compound having a new molecular orbital with a low bandgap. The selection of the type of the conjugated polymer compound having a low bandgap is related to the non-covalent force between the molecules of the materials, the predominant element in a predominant molecule, and their light absorption properties. When the molecules of the predominant molecule in the material of the electron donor are in a situation of self-assembly or an arrangement in a solid state to form an ordered structure, the intermolecular non-covalent force will influence the stacking and the crystalline properties of the electron donor, and further determine the characteristics of the charge mobility of charge carriers, the short-circuit current and the power conversion efficiency of the device. Because of the fact that the chemical properties of the predominant element in the predominant molecule are determined by its outmost electron configuration and the outermost electron configurations of the elements of the same group in the Periodic Table are similar, the elements in the same group possess similar chemical properties. For example, furan, thiophene, and selenophene have similar chemical properties. With respect to the light absorption property, the materials for the electron donor are selected from materials having an absorption in the wavelength in the region from 600 nm to 800 nm.

An expected chemical property of a polymer can be obtained by modifying a variety of the functional groups in the main chain of the polymer. The materials of the functional group in the main chain of the polymer include a derivative of furan, thiophene, selenophene, tellurophene, pyrrol, cyclopentene, silole, germole, stannole, oxadiazole, thiadiazole, selenadiazole, triazole, diazole, pyran, pyrrole and pyrazine, or a combination thereof. The π-aromatic group is one selected from a group consisting of a $C_{3-16}$ aromatic hydrocarbon, a unsaturated $C_{3-16}$ heteroaromatic ring, and a polycyclic aromatic hydrocarbon.

The derivative of the fullerene is one of the [6,6]-phenyl-$C_{61}$-butyric acid methyl ester ($PC_{61}BM$) derivative or the [6,6]-phenyl-$C_{71}$-butyric acid methyl ester ($PC_{71}BM$) derivative.

The conjugated polymer containing the porphyrin compound of the present invention is applicable to a polymer solar cell, and especially applicable to an organic thin film solar cell. By modulating the position and the ratio of the porphyrin compound to the conjugated polymer having a low bandgap, the light absorption region and the influence on the stacking can effectively controlled, resulting in a light-sensitized material having both advantages of the conjugated polymer and the porphyrin compound accordingly. The obtained conjugated polymer containing the porphyrin compound is mixed with $PC_{71}BM$ or $PC_{61}BM$ in a variety of the organic solvent to form the active layer material of an organic thin film solar cell. The active layer material forms a thin film by a process, such as by spin coating, on the area between the device layers of the organic thin film solar cell. An organic thin film solar cell having a high PCE of 8.2% and having an absorption of the approximate full spectrum of sunlight is obtained. The data from the resulting solar cells are shown in Table 8.

The present invention discloses a series of the conjugated polymers containing a porphyrin compound. The synthetic reactions include the following four processes.

Process 1

FIG. 1(a) shows a synthesis reaction of a monomer of the low bandgap polymer. The obtained monomer (Compound 4) acts as an electron acceptor (A) of the conjugated polymer. When the substituent $Y_1$ and $Y_2$ in Compound 1 shown in FIG. 1(a) is substituted by fluorine (F) and the substituent X is substituted by sulfur (S), the resulting Compound 1 will be 5,6-difluoro-2,1,3 benzothiadiazole. The 5,6-difluoro-2,1,3 benzothiadiazole further reacts with iodine and sulfuric acid, an iodization reaction occurs, and 5,6-difluoro-4,7-diiodo-2,1,3 benzothiadiazole (Compound 2) is formed. Compound 2 reacts with an organic tin compound (Compound a) as well as a catalyst, such as bis(triphenylphosphine)palladium(II) dichloride ($Pd(PPh_3)_2Cl_2$), a Stille reaction occurs, and Compound 3 is formed. Lithium diisopropylamide (LDA) and chlorotrimethylstannane ($Sn(CH_3)_3Cl$) are used to react with Compound 3 to form Compound 4.

Process 2

FIG. 1(b) shows a schematic diagram showing a synthesis reaction of another monomer of the low bandgap polymer. The obtained monomer (Compound 10) acts as an electron donor (D) of the conjugated polymer. First, N-bromosuccinimide (NBS), triphenylphosphine ($PPh_3$) and dichloromethane ($CH_2Cl_2$) as a solvent are used to react with an alcohol compound (Compound 5), a bromination reaction occurs, and a bromoalkane compound (Compound 6) is formed. Then, Compound 6 reacts with a metallic magnesium in tetrahydrofuran (THF) as a solvent and a Grignard reagent (Compound 7) is formed. In the solvent THF, a bromo aromatic compound (Compound b) reacts with Compound 7, a substitution reaction occurs, and Compound 8 is formed. After that, NBS reacts with Compound 8 in the dimethylformamide (DMF), a bromination reaction occurs, and Compound 9 is formed. Finally, on the condition that $PdCl_2$ $(PhCN)_2$ acts as a catalyst, AgF acts as an oxidation agent and dimethyl sulfoxide (DMSO) acts as a solvent, an oxidation coupling reaction occurs to Compound 9, and Compound 10 is formed.

Each of $R_2$ and $R_3$ is one independently selected from a group consisting of a hydrogen, a straight-chain saturated $C_{1-30}$ alkyl group and a $C_{6-16}$ aryl group. Each of X, $X_1$ and $X_2$ is one independently selected from a group consisting of oxygen (O), sulfur (S), selenium (Se), tellurium (Te), NR, $CR_2$, $SiR_2$, $GeR_2$ and $SnR_2$, wherein R is a hydrogen, a straight-chain saturated $C_{1-30}$ alkyl group and a $C_{6-16}$ aryl group, and each of Y, $Y_1$ and $Y_2$ is one selected from a group consisting of a hydrogen, a halogen, an alkyl halide, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group.

Process 3

FIG. 1(c) shows a synthesis reaction of the low bandgap polymer (Compound 13). By using the Stille coupling reaction, Compound 4 and Compound 10 are polymerized with the assistance of microwaves, and Compound 13 is formed.

Process 4

FIG. 1(f) shows a synthesis reaction of the conjugated polymer with the porphyrin compound. By using the Stille coupling reaction, Compound 4, Compound 10 and 1,3-dibromo-porphyrinphenyl compound (Compound 11) are polymerized with the assistance of microwaves, and a conjugated polymer with the porphyrin compound (Compound 12) is formed. Compound 12 is synthesized by introducing the porphyrin compound to the main chains of the polymers (i.e., Compound 4 and Compound 10) through a compound having a phenyl ring or another aromatic compound to synthesize the conjugated polymer with the porphyrin compound on a side chain thereof (Compound 12). The design of the present invention can prevent the porphyrin compound from directly bonding to the main chain of the conjugated polymer, which would further decrease the conjugation of the main conjugated chain.

The conjugated polymer with the porphyrin compound can be formed by selecting different functional groups of the porphyrin compound, different monomers, and monomers with different ratios. In addition, Compound 4, Compound 10 and 1,3-dibromophenyl compound can be polymerized with the assistance of microwaves by using the Stille coupling reaction to form a comparative product (Compound 14), which is not shown in the figures, as a conjugated low bandgap polymer without a porphyrin compound bonded thereto.

In order to understand the influence on the chemical properties of the whole compound, i.e. Compound 13, resulting from the bonding of a functional group to the main chain of the conjugated polymer, Compound 13-1 is formed when each of $Y_1$ and $Y_2$ in Compound 13 is substituted with a fluorine (—F), each of X, $X_1$ and $X_2$ is substituted with a sulfur (—S), and $R_2$ and $R_3$ are respectively substituted with straight-chain saturated alkyl groups-$C_8H_7$ and —$C_{10}H_{21}$, and Compound 13-2 is formed when each of $Y_1$ and $Y_2$ in Compound 13 is substituted with a hydrogen (—H), each of X, $X_1$ and $X_2$ is substituted with a sulfur (—S), and $R_2$ and $R_3$ are respectively substituted with straight-chain saturated alkyl groups-$C_8H_7$ and —$C_{10}H_{21}$. Compounds 13-1 and 13-2 in solution states were tested using optical property analysis, such as a UV-Vis test. The obtained spectrums, not shown in the figures, show that there are three absorption peaks for each of Compounds 13-1 and 13-2, wherein those peaks are in the wavelength ranges of about 400 nm, 560 nm and 700 nm. The peak located in the wavelength at about 400 nm indicates that the absorption is caused by the absorption of $\pi$-$\pi$* transition, the peak at about 560 nm indicates that the absorption is the absorption of the intramolecular charge transfer (ICT) caused by the effects of electron donating and withdrawing generated by the electron donor and the electron acceptor in the molecule of the conjugated polymer, and the peak at about 700 nm indicates that the absorption is caused by the intermolecular aggregation of the conjugated polymer. The absorption peak of Compound 13-1, compared to that of Compound 13-2, has a phenomenon of a blueshift, which is not shown in the figures. Because the fluorine atom has the tendency of withdrawing the electron, it lowers the energy levels of HOMO and LUMO in the conjugated polymer and increases the bandgap accordingly, so the phenomenon of the blueshift occurs, which means that the absorption peak moves toward the region of the shorter wavelengths. In addition, based on the results from the optical property analysis, it can be seen that Compound 13-1 has larger intermolecular interactive forces. Based on the test results, which are not shown, of the UV-Vis optical property analysis on Compounds 13-1 and 13-2 in thin film states, it is seen that because the stacking among the molecules of the conjugated polymer is denser, the absorption peaks of both of Compounds 13-1 and 13-2 appear to redshift, which means the absorption peaks move toward the region of longer wavelengths. The maximum absorption peaks of both Compounds 13-1 and 13-2 are in the wavelength of about 650 nm, which are not shown. It can be obtained from the preceding descriptions that the optical bandgap of Compounds 13-1 and 13-2 are respectively –1.65 eV and –1.59 eV.

When Compounds 13-1 and 13-2 in solution states were tested with an electrochemical analysis, which is not shown, such as cyclic voltammetry (CV), it was calculated that HOMO and LUMO of Compound 13-1 are –5.54 eV and –3.68 eV, respectively, and those of Compound 13-2 are –5.18 eV and –3.57 eV respectively. The lower energy level of HOMO can effectively increase the open-circuit voltage of a solar cell device, and can increase the anti-oxidation ability of an organic field-effect transistor (OFET). It can be seen from the above that the energy levels of HOMO and LUMO in Compound 13-1 are both lower. Therefore, Compound 13-1 containing fluorine atoms can increase the non-covalent force and further effectively promote the efficiency and stability of the devices.

Compounds 13-1 and 13-2, which act as electron donors, are combined together with $PC_{71}BM$, which acts as an electron acceptor, to form the active layer material in a solar cell device, and the structure comprises: a cathode, a hole injection layer, an active layer, an electron transmission layer, and an anode. The structures can be categorized according to the layer arrangements as a normal structure and an inverted structure. Solar cell devices, which are not shown, having an heterojunction device with the normal structure (ITO/ZnO/Compound 13-1: $PC_{71}BM$/Ca/Al) and with the inverted structure (ITO/ZnO/Compound 13-1: $PC_{71}BM$/$MoO_3$/Ag) were measured using a solar simulator (AM 1.5 G 100 mW/cm$^2$), and results are not shown. For the device having the normal structure, its PCE value is 6.41%, its open-circuit voltage is 0.78 V, its short-circuit current is 12.17 mA/cm$^2$ and its fill factor is 67.5%. For the device having the inverted structure, its PCE value is 6.82%, its open-circuit voltage is 0.77 V, its short-circuit current 13.51 mA/cm$^2$, and its fill factor is 65.6%. The improvement to the efficiency of the device arises mainly from the improvement to the short-circuit current. From the diagram of IPCE, which is not shown, it can be seen that the external quantum efficiency of the device having the normal structure is 50% at most, while that of the device having an inverted structure is as much as 65%. The possible reason is that the surface energy of the electron donor is low because the conjugated polymer contains fluorine, so when the active layer is formed, the polymeric material will be distributed to an upper position on the active layer where it is much closer to the air, and $PC_{71}BM$ will be distributed to a lower position on the active layer, which causes a vertical phase separation on the active layer. This kind of material distribution matches the directions of collecting the electrons and the holes of the device having the inverted structure, and increases the short-circuit current value of the device.

With respect to the research on the influence on the whole compound when Compound 13 has different groups of elements, $X_1$ is substituted with O, S and Se to respectively form Compound 13-O, Compound 13-S and Compound 13-Se, wherein $Y_1$ and $Y_2$ are substituted with F, X and $X_2$ are substituted with S, and $R_2$ and $R_3$ are substituted respectively with $C_8H_7$ and $C_{10}H_{21}$. Compounds 13-O, 13-S and 13-Se were tested with optical and electrical analyses, and the results are not shown. It can be seen that the energy level of HOMO from each of these three compounds is higher if the atomic number of the substituent is higher. For example, the energy level of HOMO of Compound 13-O is –5.57 eV and that of Compound 13-Se is –5.39 eV, whereas the energy levels of LUMO of Compound 13-O and 13-Se are –3.56 eV and –3.70 eV respectively. It can be seen that the bandgap of Compound 13-O is the largest among these three compounds and its absorption peak has the phenomenon of a blueshift, while the bandgap of Compound 13-Se is the smallest and its absorption peak has the phenomenon of a redshift. In comparison with the thermal, optical and electrical properties of Compounds 13-1, 13-O and 13-Se, it can be observed that the intermolecular force of Compound 13-O in the thin film state is the smallest while that of Compound 13-Se is the largest. From the absorption peak intensity of the molecular stacking obtained from the UV-Vis diagram, it can be calculated that the crystalline degree of Compound 13-Se is the highest among these three compounds, and the results of the thermal analysis, UV-Vis and XRD, results not shown, can prove this. Accordingly, the electron mobility of Compound 13-Se is high and is as much as 0.35 cm$^2$ V$^{-1}$ s$^{-1}$, and that of Compound 13-O is lower than the other two compounds because of its poor crystallinity and film forming property. When the three compounds, Compounds 13-O, 13-Se and 13-1, are applied to the materials in an organic thin film solar cell device and the structure of the device is the normal structure, the performance of Compound 13-Se is inferior to that of Compound 13-1 because the influence caused by the voltage drop is significant. However, the increment of current collected by Compound 13-Se is larger than that of Compound 13-1 when the structure of the device is the inverted structure, therefore, the increment of the overall efficiency of Compound 13-Se is more significant than that of Compound 13-1. In addition, although the energy level of HOMO in Compound 13-O is the lowest and consequently the $V_{oc}$ of the device is the highest, the film forming property and the electron mobility are poor, which causes the short-circuit current and the fill factor to be poor, and so the efficiency of the device is low accordingly.

It is seen from the above that, the efficiencies of the organic thin film solar cell device will be influenced by the functional groups selected in the conjugated polymer which are used to manufacture the device. Therefore, in the conjugated low bandgap polymer composed of a plurality of monomers and a π aromatic group, the π aromatic group can be one of an unsaturated $C_{3-16}$ aromatic ring and unsaturated $C_{3-16}$ heteroaromatic aromatic ring, wherein the unsaturated $C_{3-16}$ heteroaromatic ring includes at least a heteroatom, and the heteroatom includes at least one selected from a group consisting of N, S, O, and Se, and the unsaturated $C_{3-16}$ heteroaromatic ring further includes $N_{1-3}$. The plurality of monomers, depending on the electron donating and withdrawing properties they possess, are categorized as the compound of the electron donor D and the compound of the electron acceptor A, wherein each of D and A is one selected from a group consisting of an unsaturated 5-membered heterocyclic ring, an unsaturated 6-membered heterocyclic ring, an unsaturated 5-membered heteroaromatic ring, and an unsaturated 6-membered heteroaromatic ring. For example, D is one selected from a group consisting of $D_1$, $D_2$, $D_3$, $D_4$, $D_5$, and $D_6$, and shown as follows.

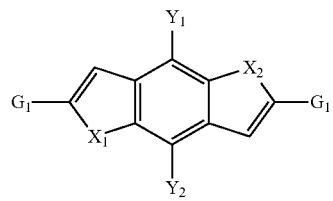

$D_1$

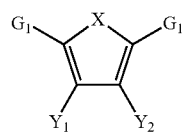

$D_2$

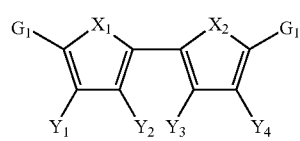

$D_3$

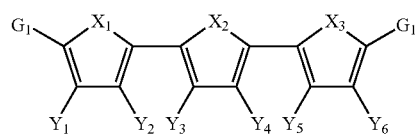

$D_4$

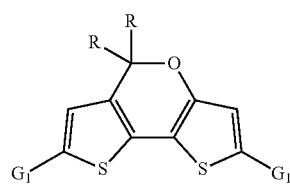

$D_5$

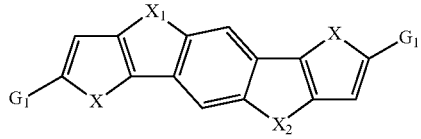

$D_6$

A is one selected from a group consisting of $A_1$, $A_2$, $A_3$, $A_4$, $A_5$, $A_6$, $A_7$, $A_8$, $A_9$, and $A_{10}$, and shown as follows.

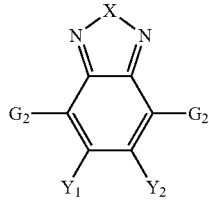

$A_1$

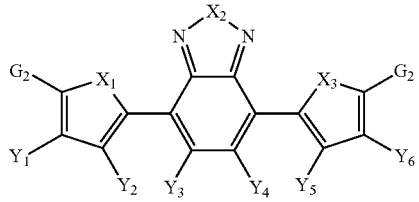

$A_2$

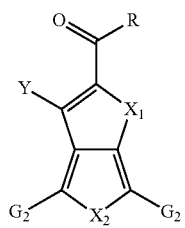

$A_3$

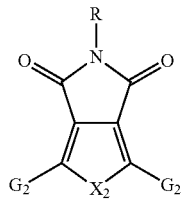

$A_4$

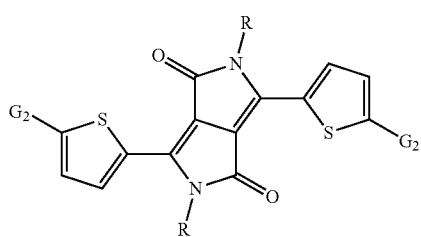

$A_5$

-continued

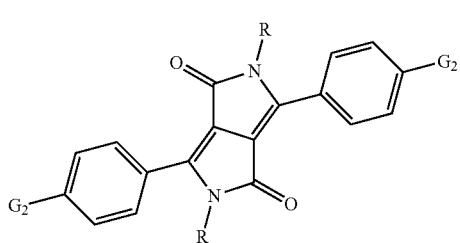
A6

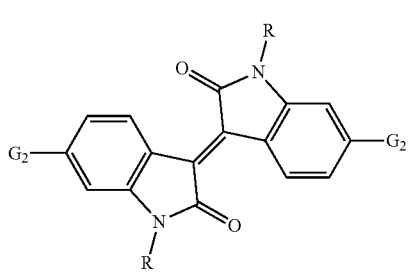
A7

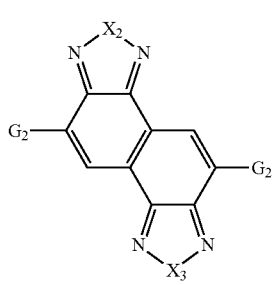
A8

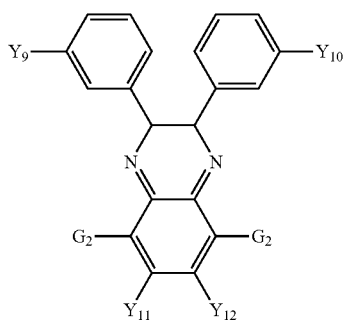
A9

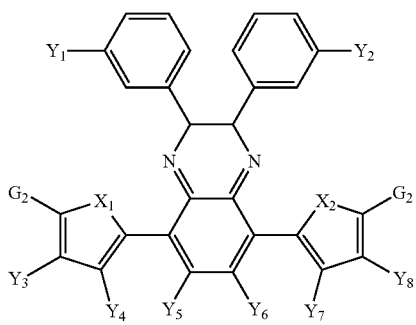
A10

R is one of hydrogen, a straight-chain saturated $C_{1-30}$ alkyl group and a $C_{6-16}$ aryl group; each of X and $X_{1-3}$ is one independently selected from a group consisting of O, S, Se, Te, NQ, $CQ_2$, $SiQ_2$, $GeQ_2$ and $SnQ_2$, wherein Q is one of hydrogen, a straight-chain saturated $C_{1-30}$ alkyl group and a $C_{6-16}$ aryl group, and each of Y and $Y_{1-12}$ is one independently selected from a group consisting of a hydrogen, a halogen, an alkyl halide, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group. Furthermore, $G_1$ is one of $\pi$ and A; and $G_2$ is one of $\pi$ and D.

FIGS. 1(*d*) and 1(*e*) show the common structural formulas of the conjugated polymer with the porphyrin compound in the embodiments of the present invention. Each of these formulas consist of a main chain and a side chain, wherein the main chain consists of the compound of the electron acceptor A, the compound of the electron donor D and the compound $\pi$ of the $\pi$ aromatic group. The structure and the properties of the main chain can be varied by changing the different ratios of a and b. The parameter n is the number of repeated units. The side chain consists of a porphyrin compound (Por).

The porphyrin compound (Por) is a macro molecular heterocyclic compound and is one selected from a group consisting of $P_1$, $P_2$ and $P_3$, and shown as follows,

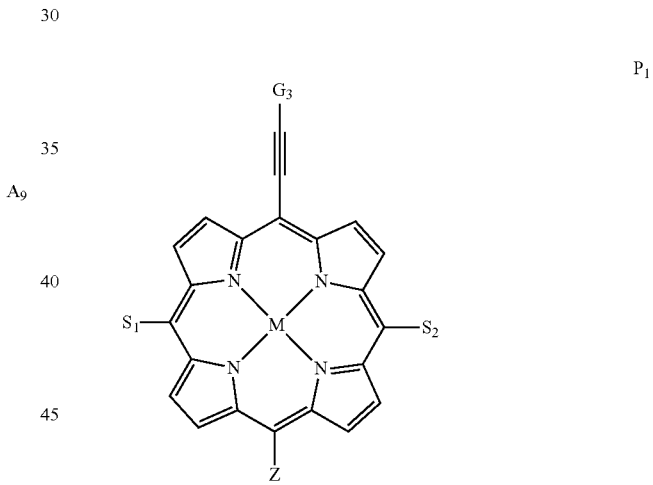
P1

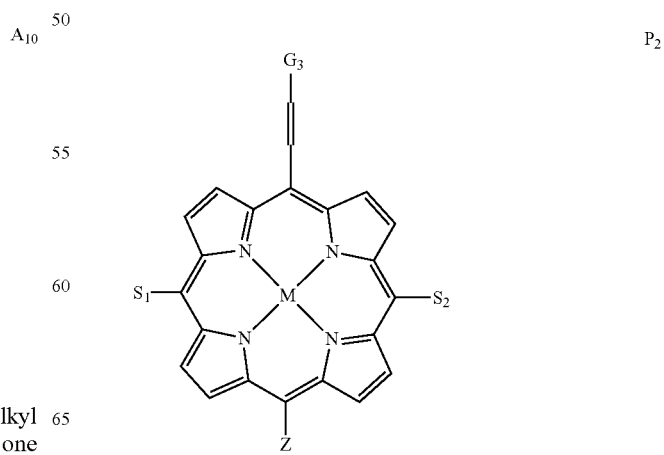
P2

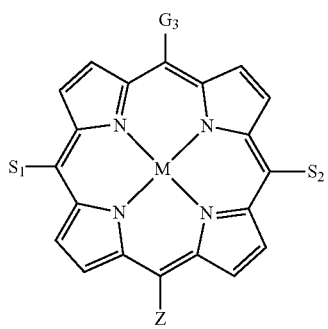

wherein $G_3$ is π; M is one of $Zn^{2+}$ and $2H^+$; each of $S_1$ and $S_2$ is independently selected from one of a straight-chain saturated $C_{1-30}$ alkyl group, a branched-chain saturated $C_{1-30}$ alkyl group, and an aryl group, and the aryl group has a phenyl group, wherein the phenyl group includes at least a substituent, the substituent is one independently selected from a group consisting of a hydrogen, a halogen, an alkyl halide group, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group; and Z is one selected from a group consisting of $Z_1$, $Z_2$, $Z_3$, $Z_4$, $Z_5$, $Z_6$, $Z_7$ and $Z_8$, and shown as follows, $Z_1$

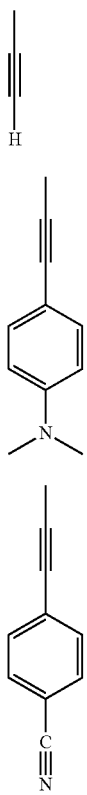

$Z_2$ $Z_3$

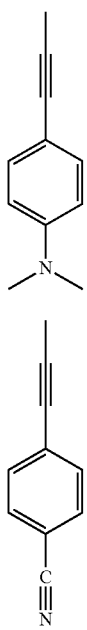

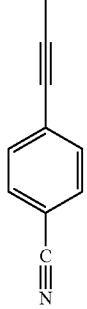

$P_3$ $Z_4$

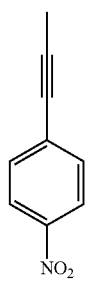

$Z_5$

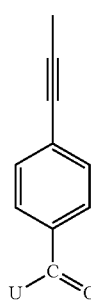

$Z_6$

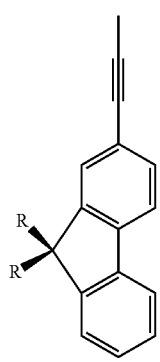

$Z_7$

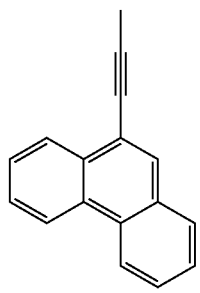

$Z_8$

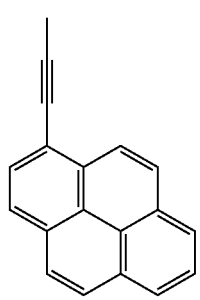

wherein each of $S_1$ and $S_2$ is 1,3-bis(dodecyloxy)benzene, R is one selected from a group consisting of a hydrogen, a straight-chain saturated $C_{1-30}$ alkyl group, a branched-chain saturated $C_{1-30}$ alkyl group, and a $C_{6-16}$ aryl group; U is one selected from a group consisting of OR, chlorine, bromine, and iodine, each of a and b in the common formula range from 1 to 20, and the coefficient n in the common formula ranges from 1 to 100.

Please refer to FIG. 1(f). Compound 12 has absorption in the blue light region which results mainly from the blue light absorption of the Soret band generated by the side chain, i.e. the porphyrin compound. This design can amend the shortage of the main chain having insufficient absorption in the blue light region. Compound 12 can be categorized by whether the substituent Z in the porphyrin compound contains a functional group, which type of functional group it is, such as amine or pyrene, and the ratio of the main chain (D, A, and π) of the polymer to the porphyrin compound (Por), as shown in Tables 1 and 2.

TABLE 1

| Notation of the conjugated polymer | Porphyrin compound, Por | Substituent Z in the porphyrin compound |
|---|---|---|
| P0 | Without | Without |
| PPor | With | H— |
| PPor—Me$_2$N | With | (CH$_3$)$_2$N— |
| PPor—Py | With | 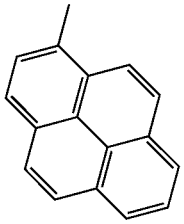 C$_{16}$H$_{10}$— |

TABLE 2

| Notation of the conjugated polymer | Main chain of the polymer (D, A and π)/porphyrin compound, Por |
|---|---|
| PPor-Py-1 | 2/1 |
| PPor-Py-2 | 5/1 |

Table 3 shows the thermal properties, measured by instruments such as a Thermogravimetric Analysis (TGA) and a Differential Scanning calorimeter (DSC), of the conjugated polymers shown in Tables 1 and 2. It can be seen from Table 3 that the thermal-decomposition temperature ($T_d$) of these five conjugated polymers are all above 400° C., which means the thermal stability properties of these conjugated polymers are quite excellent. In addition, according to the data for the melting point, another thermal property measured by the DSC, of the five conjugated polymers shown in Table 3, the conjugated polymer P0, which has no introduced porphyrin compound, has the highest melting point of 287° C. After introducing the porphyrin compound to the side chain of the main chain in the conjugated polymer, due to the fact that the porphyrin compound is a more bulky functional group, a steric hindrance at the side of the conjugated polymer is significant and influences the overall stacking of the molecules. Therefore, the melting point of the conjugated polymer with the porphyrin compound is lower and the thermal peak observed by the DSC is not significant. After adjusting the ratios of the porphyrin compounds, i.e. PPor-Py-2, in the conjugated polymer, even if the melting point of the conjugated polymer is not increased, the long-wavelength shoulder absorption peak becomes more significant. This result is possibly due to the fact that the stacking hindrance caused by the porphyrin is reduced and the stacking order among the conjugated polymers is improved.

TABLE 3

| Notification of the conjugated polymer | $T_d$ (° C.) | $T_m$ (° C.) | $T_c$ (° C.) |
|---|---|---|---|
| P0 | 447 | 287 | 279 |
| PPor | 450 | 258 | 249 |
| PPor-Me$_2$N | 428 | 243 | 224 |
| PPor-Py-1 | 441 | 268 | 265 |
| PPor-Py-2 | 445 | 264 | 245 |

To study how the different functional groups of the porphyrin compound will influence the properties of the porphyrin compounds, three porphyrin compounds, such as PPor, PPor-Me$_2$N and PPor-Py, were used as the objects to be measured. Based on the UV-Vis diagrams, which are not shown, in which the objects to be measured are all in solution states, it can be seen that when there is no functional group PPor on the porphyrin compound, there will be an absorption peak in the primary Soret band at a wavelength of 440 nm and two areas of weaker absorption in Q bands in the wavelengths of 567 nm and 618 nm. When Z on the porphyrin compound is an electron donor, such as (CH$_3$)$_2$N—, or an electron donor with the compound of the π aromatic group having a prolonged conjugation length, such as PPor-Py, in which Z in the porphyrin compound is C$_{16}$H$_{10}$—, the light absorption peak will have a redshift because the bandgap becomes smaller. In addition, the primary absorption peaks in the Soret band are located in the wavelengths of 459 nm and 466 nm. However, the intensity of the absorption peak in the Soret band of the electron donor will be lowered to an extent less than that of the original porphyrin compound. With respect to the absorption in the Q band, the absorption peaks of the two porphyrin compounds having functional groups are single absorption peaks, with wavelengths of 667 nm and 670 nm, but both of the light absorption coefficients of these two porphyrin compounds are higher than the absorption peak in the Q band of the original porphyrin compound.

It can been seen from the UV-Vis diagrams, in which the objects to be measured are in the solution states, that the porphyrin compound having no functional group has a phenomenon of a slight blueshift, which is possibly caused by an H-type aggregation, whereas the porphyrin compounds, such as Por-Me$_2$N and Por-Py, having a functional group, such as (CH$_3$)$_2$N— and C$_{16}$H$_{10}$—, has a phenomenon of a redshift, which is possibly caused by a J-type aggregation.

Figure 2A:
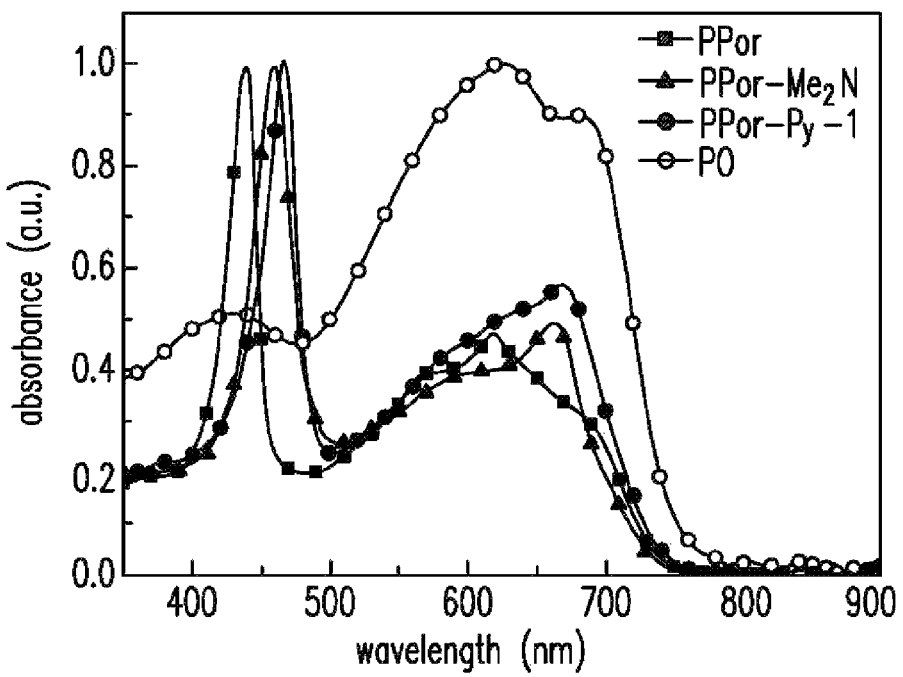
FIGS. 2(a) and 2(b) are UV/VIS absorption spectra of the conjugated polymers having different porphyrin compounds according to an embodiment of the present invention, wherein FIG. 2 (a) shows the results of detected objects in solution states, and FIG. 2 (b) shows the results of the detected objects in thin film states.
Figure 2B:
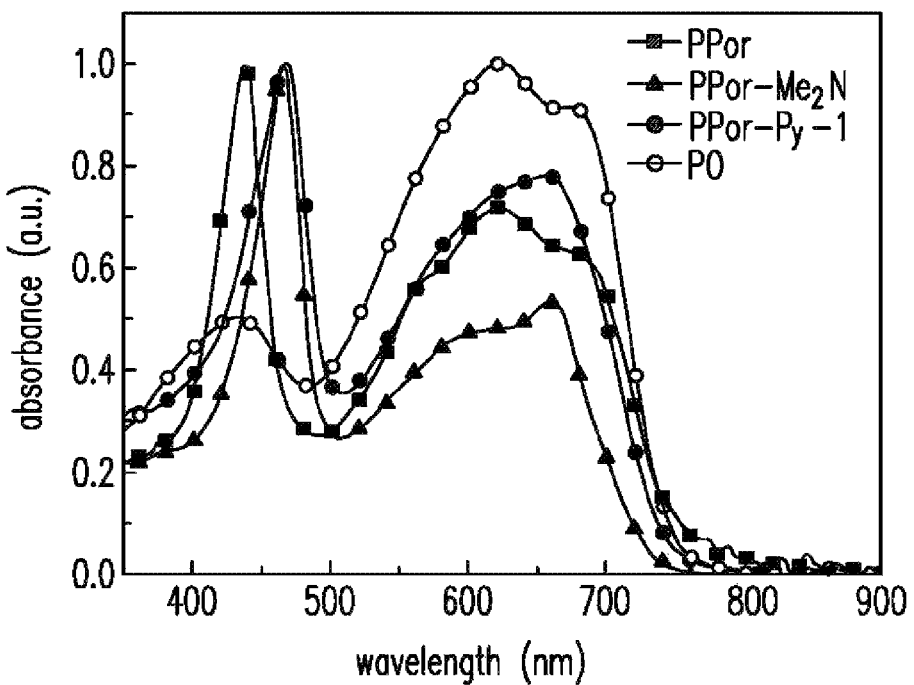

FIGS. 2(a) and 2(b) show the absorption spectrums of UV-Vis of the conjugated polymers having different porphyrin compounds according to an embodiment of the present invention, where FIG. 2(a) shows that the objects to be measured are in the solution state, and FIG. 2(b) shows that the objects to be measured are in the thin film state. The conjugated polymer compounds, which are PPor, PPor-Me$_2$N, PPor-Py-1 and P0, to be measured are shown in Tables 1 and 2. As to what is shown in FIG. 2(a) and Table 4, it can be seen that, for the conjugated polymer P0, there was weaker absorption of π-π* transition [a] in the wavelength of 430 nm, a primary absorption peak [b] in the wavelength of 625 nm which results from the intramolecular charge transfer (ICT), and a stacking absorption in the wavelength of 682 nm, which is generated by the aggregation of the polymers. Therefore, it can be seen that, if there are no bulky porphyrin compounds on the side chain of the polymer, the polymer itself possesses a good stacking property. This phenomenon can also be proven by the experimental results of the DSC (not shown). After introducing the porphyrin compound to the main chain of the polymer, the absorption peaks in the Soret band and the Q band specifically possessed by the porphyrin compound are observed in the absorption spectrum of the conjugated polymer, in which the intensity of the absorption peak in the Soret band even exceeded the intensity of the absorption peak caused by the ICT, while the absorption peak generated by the stacking of the polymer was not observed. This phenomenon corresponds to the experimental results from the DSC.

As to what is shown in FIG. 2(b) and Table 4, it can be seen that the intensities of the absorption peak resulting from the ICT of the polymer and the Q band of the porphyrin compound increased. However, the absorption peak generated from the aggregation of the polymer is still not observed, and the absorption peak of the polymer in the thin film state has no significant phenomenon of a redshift. This shows that the excess of the bulky porphyrin compound in the side chain of the polymer causes a hindrance to the stacking arrangement of the polymers themselves.

TABLE 4

| Notation of the conjugated polymer | Absorption peak wavelength of the conjugated polymer in a solution state, $\lambda_{max}$ (nm) | | Absorption peak wavelength of the conjugated polymer in a thin film state, $\lambda_{max}$ (nm) | | $\lambda_{onset}$ (nm) |
|---|---|---|---|---|---|
| | Soret band | Q band | Soret band | Q band | |
| PPor | 439 | 569, 618 | 439 | 750 | 750 |
| PPor-Me2N | 459 | 663 | 663 | 745 | 745 |
| PPor-Py-1 | 466 | 668 | 659 | 750 | 750 |
| P0 | 430 [a] | 625 [b] | 625 [a] | 760 [b] | 760 |

Figure 2C:
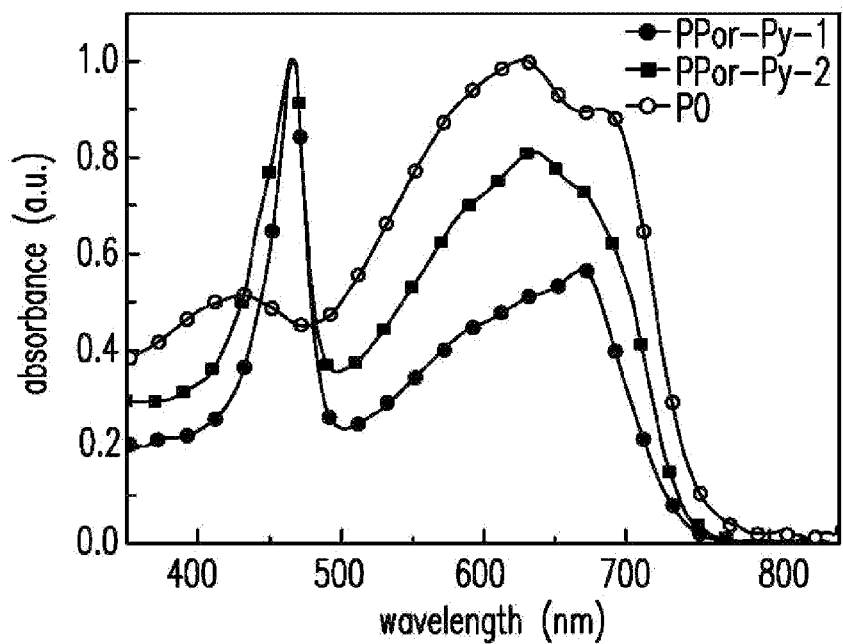
FIGS. 2(c) and 2(d) are UV/VIS absorption spectra of the conjugated polymers containing a porphyrin compound in different ratios according to an embodiment of the present invention, wherein FIG. 2 (c) shows the results of detected objects in solution states, and FIG. 2 (d) shows the results of the detected objects in thin film states.
Figure 2D:
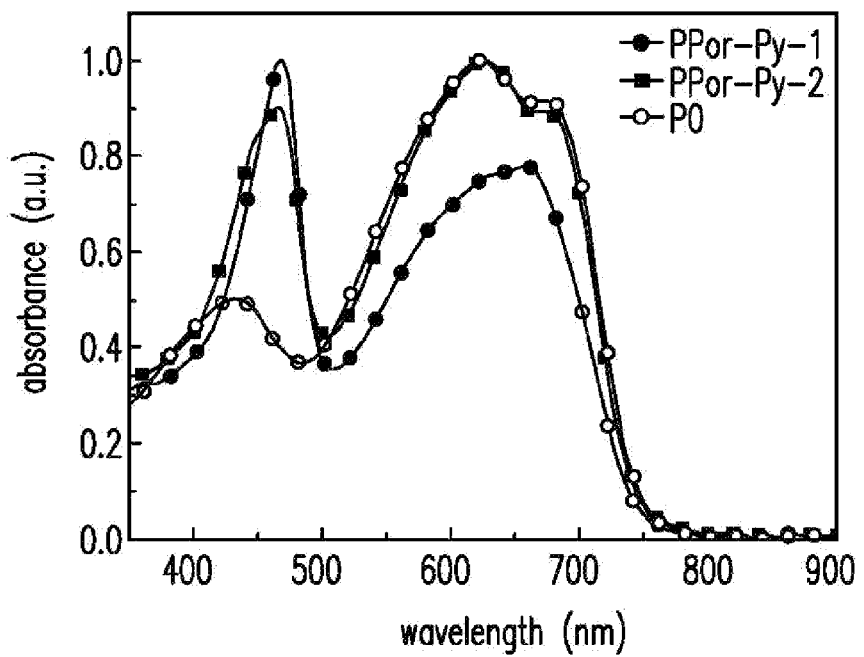

FIGS. 2(c) and 2(d) are the UV-VIS absorption spectra of the conjugated polymers having the porphyrin compounds with different ratios according to another embodiment of the present invention, wherein the objects measured in FIG. 2(c) are in the solution state and those in FIG. 2(d) are in the thin film state. The objects of the conjugated polymer to be measured, which include PPor-Py-1, PPor-Py-2 and P0, are shown in Tables 1 and 2. As to what is shown in FIG. 2(c) and Table 5, it can be seen that, when reducing the ratio of the porphyrin compound to the main chain of the polymer, the primary absorption peak of the conjugated polymer PPor-Py-2 in the solution state is in the Soret band of the porphyrin compound, whereas the absorption in the Q band is insignificant, which is replaced by a more significant absorption peak resulting from the ICT of the polymer. Accordingly, the intensities of the light absorption in the blue region and the red region are almost the same, but the stacking absorption of the polymer does not occur. As to what is shown in FIG. 2(d) and Table 5, it can be seen that, when the polymer is in the thin film state, the intensity of the absorption peak caused by the ICT of the polymer is increased dramatically, the stacking absorption peak of the polymer occurs, and the absorption peak in the Soret band of the porphyrin compound remains as well. Accordingly, it can be seen that, if the ratio of the porphyrin compound to the main chain of the polymer is controlled adequately, the light absorption in the blue region is increased, and the influence on the absorption caused by the ICT of the polymer and the stacking of the polymer are small. Therefore, it is possible to obtain a conjugated polymer having an absorption of the full spectrum by adjusting the ratio of the porphyrin compound to the main chain of the polymer to control the light absorption region. The conjugated polymer obtained is applicable to the material of the electron donor in the active layer of the organic thin film solar cell.

TABLE 5

| Notation of the conjugated polymer | Abroption peak wavelength of the conjugated polymer in a solution state, $\lambda_{max}$ (nm) | | Abroption peak wavelength of the conjugated polymer in a thin film state, $\lambda_{max}$ (nm) | | $\lambda_{onset}$ (nm) |
|---|---|---|---|---|---|
| | Soret band | Q band | Soret band | Q band | |
| PPor-Py-1 | 466 | 663 | 468 | 659 | 750 |
| PPor-Py-2 | 466 | 636 [b] | 468 | 627 [b] | 760 |
| P0 | 430 [a] | 625 [b] | 432 [a] | 625 [b] | 760 |

Figure 3A:
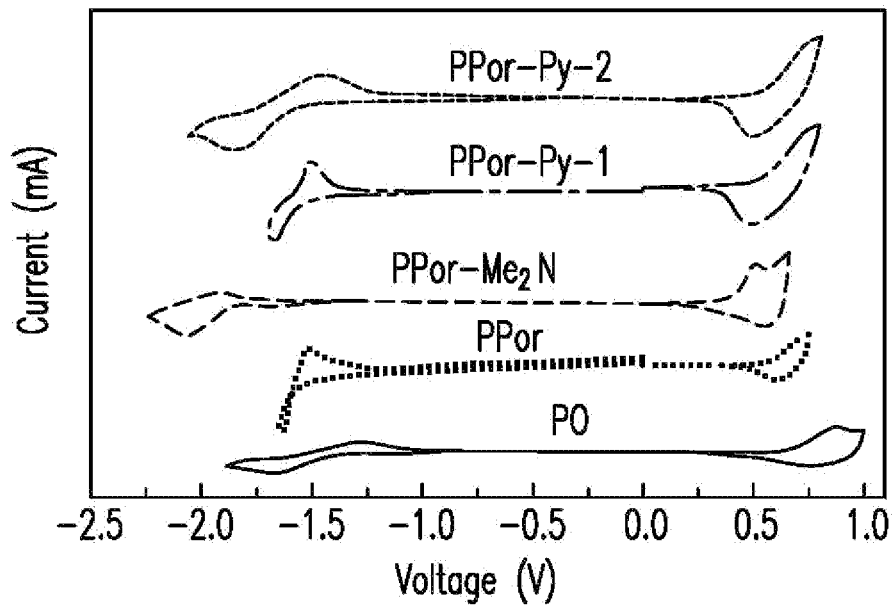
FIG. 3(a) shows cyclic voltammetric measurement results of the conjugated polymers containing different porphyrin compounds according to an embodiment of the present invention.
Figure 3B:
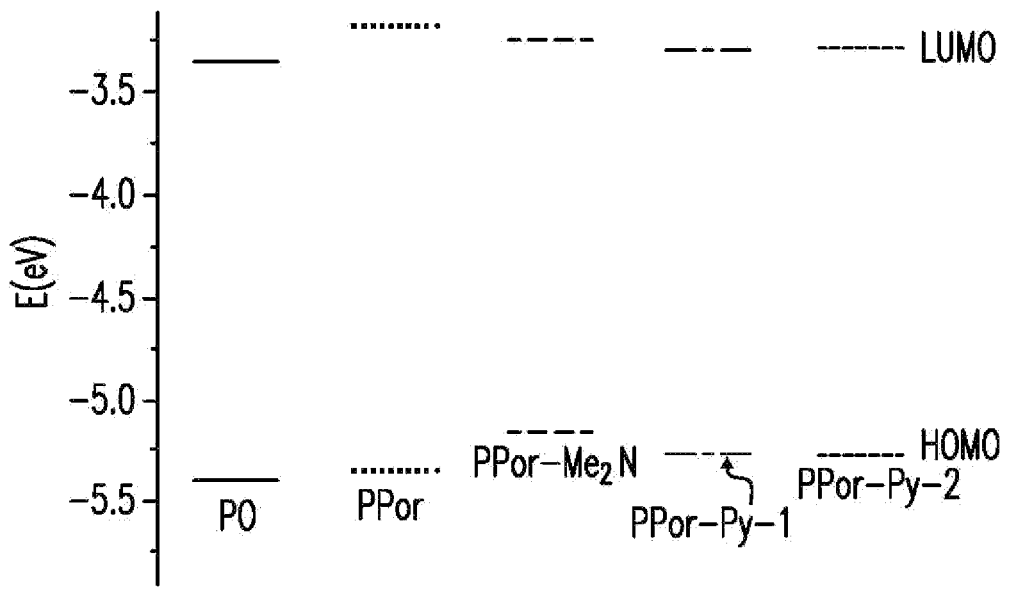
FIG. 3(b) shows energy levels of the conjugated polymers containing different porphyrin compounds according to an embodiment of the present invention.

With regard to the results of the electrochemical analysis mentioned previously, please refer to FIGS. 3(a) and 3(b). FIGS. 3(a) and 3(b) respectively show the cyclic voltammetry (CV) and the energy level of the conjugated polymer having different porphyrin compounds according to another embodiment of the present invention. The objects of the conjugated polymers to be measured, which include PPor, PPor-Me$_2$N, PPor-Py-1, PPor-Py-2 and P0, are shown in Tables 1 and 2. As to what is shown in FIG. 3(a) and Table 6, it can be seen from the curves of the oxidation-reduction of the conjugated polymer measured in the thin film state that, based on the oxidation and reduction potentials after being calibrated by ferrocene, the energy level of the HOMO of the conjugated polymer P0 is −5.41 eV. After introducing the porphyrin compound, the energy level of HOMO of the conjugated polymer PPor reached −5.36 eV; this value is not very different from that of the conjugated polymer P0. However, after introducing the porphyrin compound having the pyrene functional group Por-Py to obtain the conjugated polymer PPor-Py-1, the energy level of HOMO slightly increases to −5.29 eV. Nevertheless, the biggest influence is that, after introducing the porphyrin compound having the electron donor (CH$_3$)$_2$N— to form the conjugated polymer PPor-Me$_2$N, the energy level of HOMO dramatically increases to −5.18 eV. With regard to the electrochemical bandgap, the energy level of HOMO improved because the porphyrin compound contains the electron donating group (CH$_3$)$_2$N— so the bandgap was lowered to 1.9 eV, while those of the others are around or above 2.0 eV.

TABLE 6

| Notification of the conjugated polymer | HOMO(eV) | LUMO(eV) | $E_{g, cv}$ (eV) | $E_{g, opt}$ (eV) |
|---|---|---|---|---|
| PPor | −5.36 | −3.19 | 2.17 | 1.65 |
| PPor-Me2N | −5.18 | −3.26 | 1.92 | 1.66 |
| PPor-Py-1 | −5.29 | −3.31 | 1.98 | 1.65 |
| PPor-Py-2 | −5.30 | −3.31 | 1.99 | 1.63 |
| P0 | −5.41 | −3.35 | 2.06 | 1.63 |

Figure 4A:
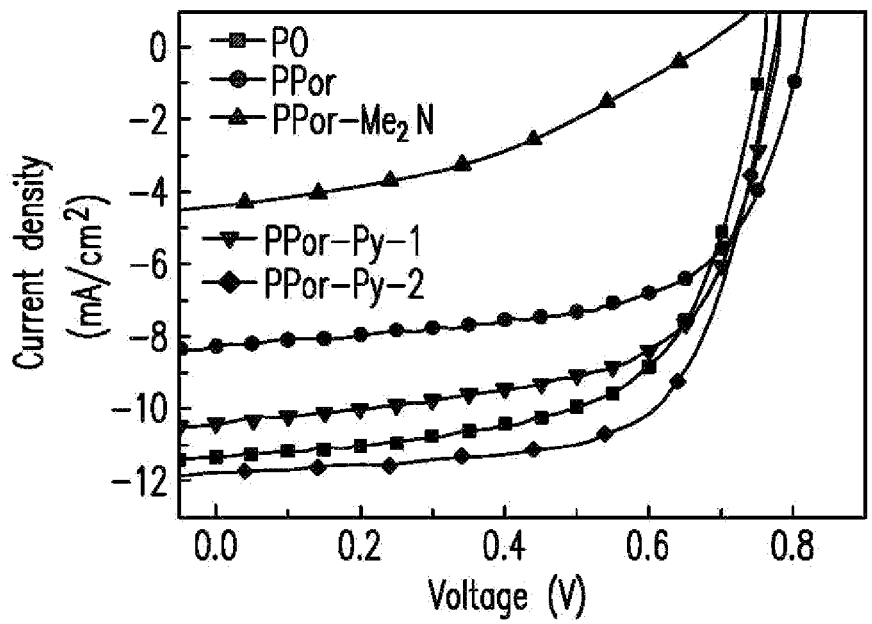
FIG. 4(a) shows the curves of current density (CD) vs. voltage (V) of solar cells of a normal structure composed of the conjugated polymers containing different porphyrin compounds according to an embodiment of the present invention.
Figure 4B:
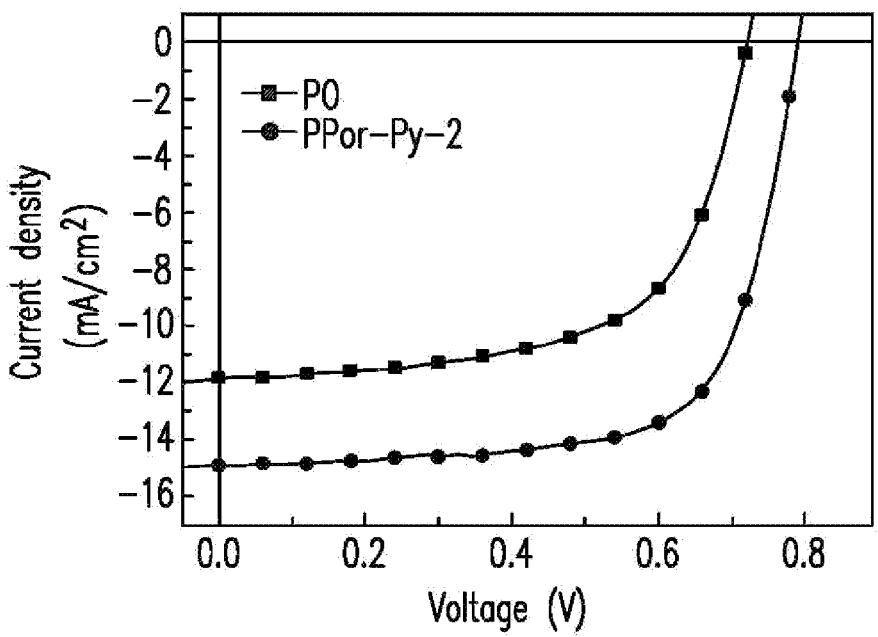
FIG. 4(b) shows the curves of current density (CD) vs. voltage (V) of solar cells of an inverted structure composed of the conjugated polymers containing different porphyrin compounds according to an embodiment of the present invention.

FIGS. 4(a) and 4(b) show the current density (CD) versus voltage of the normal and inverted structures solar cells of the conjugated polymers consisting of different porphyrin compounds according to another embodiment of the present invention. The normal and the inverted structures mean the devices have the structures of ITO/ZnO/the conjugated polymer: PC$_{71}$BM/MoO$_3$/Ag and ITO/PEDOT:PSS/the conjugated polymer: PC$_{71}$BM/Ca/Al. These solar cell devices with the two different structures were measured by a solar simulator (AM 1.5 G 100 mW/cm$^2$), and the results are shown in Tables 7 and 8. The characteristic curves of the two devices are shown in FIGS. 4(a) and 4(b).

The conjugated polymer P0 with a low bandgap has good optoelectronic conversion efficiency, in which its PCE is 5.32%, its open-circuit voltage is 0.76V, its short-circuit current is 11.34 mA/cm² and its fill factor is 61.7%. When the porphyrin is introduced to the main chain of the polymer to form the conjugated polymer PPor, the current collected by the device was expected to increase, but on the contrary, it was actually lower. The main reason is that the excess of the introduced porphyrin compound will cause the light absorption region of the device with the conjugated polymer PPor to be unable to match the spectrum of sunlight, so the sunlight cannot be effectively utilized. However, if a conjugated polymer compound with a pyrene functional group PPor is introduced to the main chain of the polymer to form the device with the conjugated polymer PPor-Py-1, due to the fact that the light absorption in the red region is increased, the current collected by the PPor-Py-1 is higher than that of the PPor, but the excess of the introduced porphyrin compound PPor causes the light absorption region of PPor-Py-1 to shift to the blue region, so the current collected by the PPor-Py-1 is not higher than that of P0. As to PPor-Me2N, the existence of the electron donating group causes the energy level of HOMO of the conjugated polymer compound to be high, so the voltage of the device is low. In addition, the conjugated polymer compound has poor solubility compared to ODCB used for manufacturing the device. Therefore, it is not possible to form a thin film with good quality, and the fill factor of the device will be too low, as well.

To improve the problem of the light absorption region of the conjugated polymer compound shifting to the blue region, the ratio of the porphyrin compound to the main chain of the polymer is reduced. With regard to the conjugated polymer compound PPor-Py-2 with a reduced ratio of the porphyrin compound to the main chain of the polymer, the intensities of the light absorption in the blue region and in the red region are almost equal. From the point of view of the overall device performance, the current collected by the device significantly increased and the overall conversion efficiency reached 6.06%, which surpasses the optoelectronic conversion efficiency of the conjugated polymer P0.

The conjugated polymer compound containing the porphyrin compound and the fullerene derivative synthesized in the present invention are applicable to the preparation of the active layer material in an organic thin film solar cell device, wherein the conjugated polymer compound acts as an electron donor, and the fullerene derivative acts as an electron acceptor. The fullerene derivative is selected from one of $PC_{61}BM$ and $PC_{71}BM$. In another preferred embodiment of the present invention, the conjugated polymer compound and the fullerene derivative are mixed in a specific ratio when preparing the active layer material, wherein the specific ratio is a weight percentage, the specific ratio of the conjugated polymer compound to the fullerene derivative is 1 to a specific value, and the specific value ranges from 0.8 to 1.3.

In order to further improve the efficiency and stability of the device, both PPor-Py-2, which has the best performance, and the comparative group P0 were used to manufacture devices having the inverted structure. As shown in FIG. 4(b) and Table 8, the optoelectronic conversion efficiency of the conjugated polymer compound PPor-Py-2 in the device with the inverted structure further increased to 8.17%, the open-circuit voltage was 0.80 V, its short-circuit current was 14.91 mA/cm², and the fill factor was 68.4%. This is due to the fact that the short-circuit current dramatically improved, and this improvement is related to the vertical phase separation in the active layer as mentioned above. In addition, the device having the inverted structure in an unpackaged state was maintained for 1000 hours and then measured. The results show that the device still kept almost 80% of the original efficiency. Therefore, this proves that the stability of the device with the inverted structure also improved.

TABLE 7

| Notation of the conjugated polymer | Conjugated polymer: D:Por:A | $PC_{71}BM$ (% in weight) | $V_{oc}$ (V) | $J_{sc}$ (mA/cm²) | FF (%) | PCE (%) |
|---|---|---|---|---|---|---|
| PPor | 2:1:3 | 1:0.8 | 0.81 | 8.25 | 62.29 | 4.16 |
| PPor-Me2N | 2:1:3 | 1:3 | 0.68 | 4.41 | 38.5 | 1.16 |
| PPor-Py-1 | 2:1:3 | 1:1 | 0.78 | 10.39 | 62.46 | 5.16 |
| PPor-Py-2 | 2.5:0.5:3 | 1:2 | 0.76 | 12.11 | 65.82 | 6.06 |
| P0 | 3:0:3 | 1:2 | 0.76 | 11.34 | 61.72 | 5.32 |

TABLE 8

| Notation of the conjugated polymer | Conjugated polymer:$PC_{71}BM$ (% in weight) | $V_{oc}$ (V) | $J_{sc}$ (mA/cm²) | FF (%) | PCE (%) |
|---|---|---|---|---|---|
| PPor-Py-2 | 1:2 | 0.80 | 68.42 | 62.46 | 8.17 |
| PPor-Py-2 (a) | 1:2 | 0.76 | 13.50 | 61.52 | 6.03 |
| P0 | 1:2 | 0.72 | 11.82 | 62.49 | 5.32 |

Embodiments

1. A conjugated polymer compound having one of the formula (1) and (2),

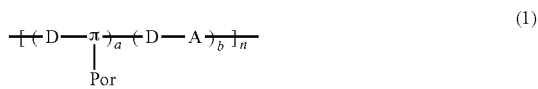

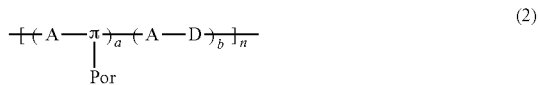

wherein π is selected from one of an unsaturated $C_{3-16}$ aromatic ring and an unsaturated $C_{3-16}$ heteroaromatic ring, wherein the unsaturated $C_{3-16}$ heteroaromatic ring includes at least a heteroatom, and the heteroatom includes at least one selected from a group consisting of N, S, O, and Se.

2. The conjugated polymer compound of Embodiment 1, wherein the unsaturated $C_{3-16}$ heteroaromatic ring further includes $N_{1-3}$.

3. The conjugated polymer compound of any one of Embodiments 1-2, wherein each of A and D is one selected from a group consisting of an unsaturated 5-membered heterocyclic ring, an unsaturated 6-membered heterocyclic ring, an unsaturated 5-membered heteroaromatic ring, and an unsaturated 6-membered heteroaromatic ring; each of a and b ranges from 1 to 20; n ranges from 1 to 100; and the Por is a macro molecular heterocyclic compound and is one selected from a group consisting of $P_1$, $P_2$ and $P_3$, wherein $P_1$, $P_2$ and $P_3$ are shown as follows.

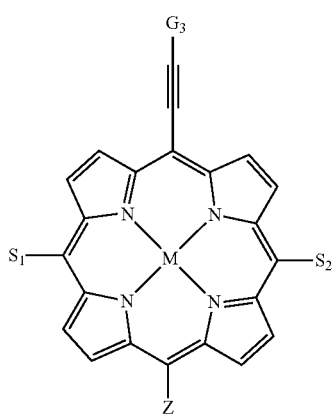

P₁

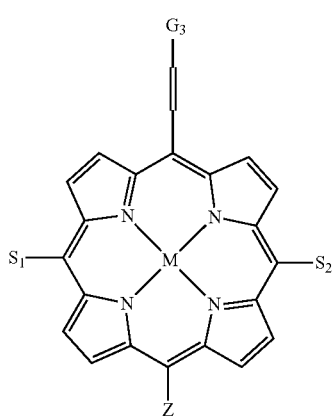

P₂

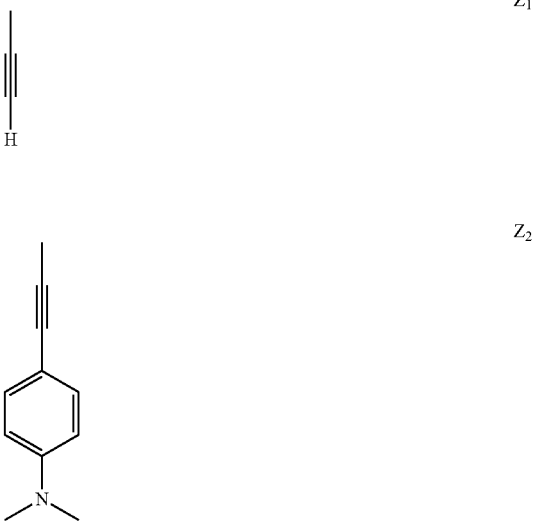

P₃

4. The conjugated polymer compound of any one of Embodiments 1-3, wherein $G_3$ is π; M is one of $Zn^{2+}$ and $2H^+$; each of $S_1$ and $S_2$ is selected from one of a straight-chain saturated $C_{1-30}$ alkyl group, a branched-chain saturated $C_{1-30}$ alkyl group, and an aryl group, and the aryl group has a phenyl group, wherein the phenyl group includes at least a substituent, the substituent is one selected from a group consisting of a hydrogen, a halogen, an alkyl halide group, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group; and Z is one selected from a group consisting of $Z_1$, $Z_2$, $Z_3$, $Z_4$, $Z_5$, $Z_6$, $Z_7$ and $Z_8$, wherein $Z_1$, $Z_2$, $Z_3$, $Z_4$, $Z_5$, $Z_6$, $Z_7$ and $Z_8$ are shown as follows.

$Z_1$

$Z_2$

$Z_3$

$Z_4$ $Z_5$

-continued

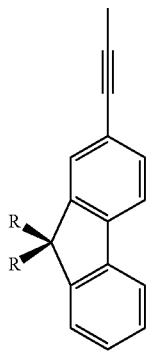

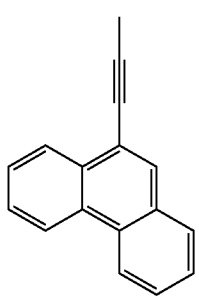

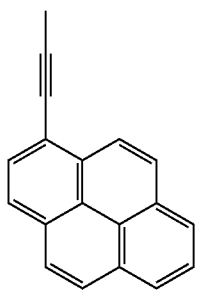

5. The conjugated polymer compound of any one of Embodiments 1-4, wherein R is one selected from a group consisting of a hydrogen, a straight-chain saturated $C_{1-30}$ alkyl group, a branched-chain saturated $C_{1-30}$ alkyl group, and a $C_{6-16}$ aryl group; and U is one selected from a group consisting of OR, chlorine, bromine, and iodine.

6. The conjugated polymer compound of any one of Embodiments 1-5, wherein D is one selected from a group consisting of $D_1$, $D_2$, $D_3$, $D_4$, $D_5$, and $D_6$, and $D_1$, $D_2$, $D_3$, $D_4$, $D_5$, and $D_6$ are shown as follows; and $D_1$ $D_2$ -continued

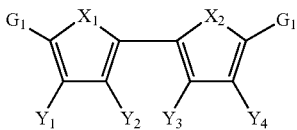
$D_3$

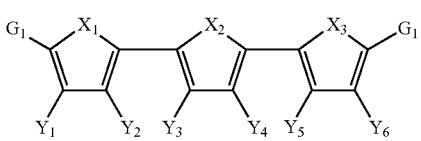
$D_4$ $D_5$ $D_6$ wherein A is one selected from a group consisting of $A_1$, $A_2$, $A_3$, $A_4$, $A_5$, $A_6$, $A_7$, $A_8$, $A_9$, and $A_{10}$, and $A_1$, $A_2$, $A_3$, $A_4$, $A_5$, $A_6$, $A_7$, $A_8$, $A_9$, and $A_{10}$, are shown as follows.

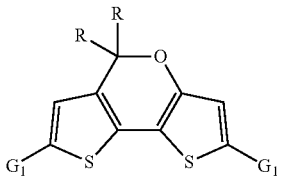
$A_1$

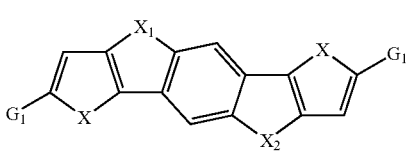
$A_2$

$A_3$

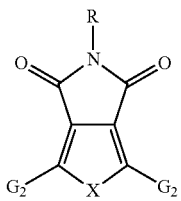

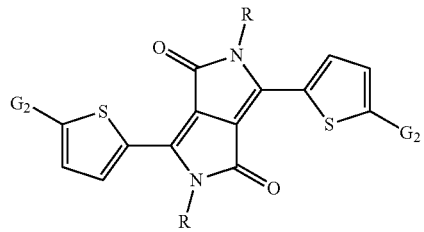

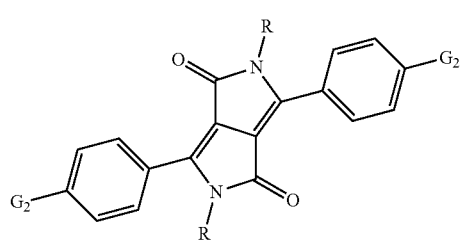

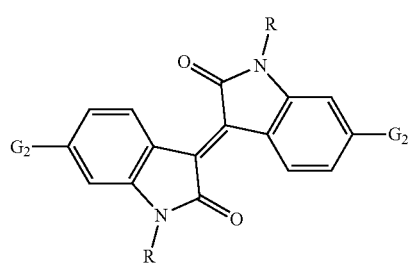

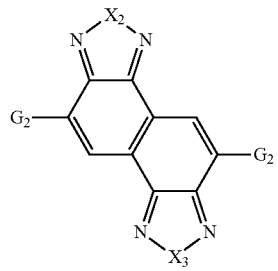

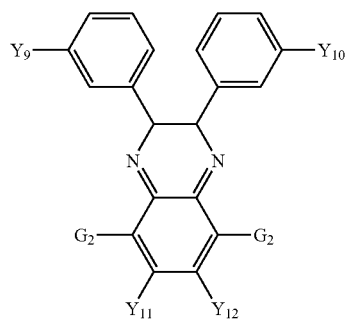

A4

A5

A6

A7

A8

A9

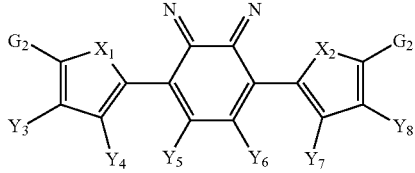

A10

7. The conjugated polymer compound of any one of Embodiments 1-6, wherein $G_1$ is one of $\pi$ and A; $G_2$ is one of $\pi$ and D; R is one of hydrogen, a straight-chain saturated $C_{1-30}$ alkyl group and a $C_{6-16}$ aryl group; each of X and $X_{1-3}$ is one selected from a group consisting of O, S, Se, Te, NQ, $CQ_2$, $SiQ_2$, $GeQ_2$ and $SnQ_2$, wherein Q is one of hydrogen, a straight-chain saturated $C_{1-30}$ alkyl group and a $C_{6-16}$ aryl group; and each of Y and $Y_{1-12}$ is one selected from a group consisting of a hydrogen, a halogen, an alkyl halide, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group.

8. The conjugated polymer compound of any one of Embodiments 1-7, wherein the halogen is one of fluorine and chlorine; and the alkyl halide is one selected from a group consisting of a trifluoromethyl, a trichloromethyl, a tribromomethyl, and a triiodomethyl.

9. A conjugated polymer compound, comprising a conjugated polymeric main chain; and a porphyrin compound having an absorption in a blue light region of solar radiation, and is bonded to the polymeric main chain to form a side chain on the polymeric main chain.

10. The conjugated polymer compound of Embodiment 9, wherein the conjugated polymeric main chain includes a $\pi$ aromatic group selected from a group consisting of a $C_{3-6}$ aromatic hydrocarbon, an unsaturated $C_{3-6}$ heteroaromatic ring and a polycyclic aromatic hydrocarbon; and a plurality of electron withdrawing/donating groups including at least a derivative of one selected from a group consisting of furan, thiophene, selenophene, tellurophene, pyrrole, cyclopentene, silole, germole, stannole, oxadiaxole, thiadiazole, selenadiazole, triazole, diazole, pyran, pyrrole, pyrazine and a combination thereof 11. The conjugated polymer compound of any one of Embodiments 9-10, wherein the unsaturated $C_{3-6}$ heteroaromatic ring includes at least a heteroatom, and the heteroatom includes at least one selected from a group consisting of N, S, O, and Se; the unsaturated $C_{3-6}$ heteroaromatic ring further includes $N_{1-3}$; and the polycyclic aromatic hydrocarbon is one of naphthalene and anthracene.

12. The conjugated polymer compound of any one of Embodiments 9-11, wherein the porphyrin compound is a macro molecular heterocyclic compound and is one selected from a group consisting of $P_1$, $P_2$ and $P_3$, wherein $P_1$, $P_2$ and $P_3$ are shown as follows.

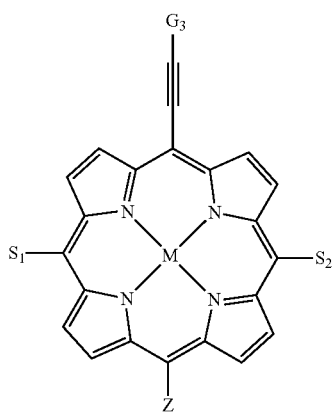

$P_1$

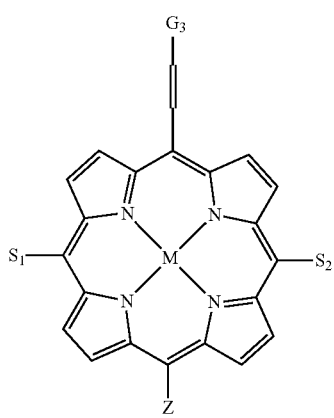

$P_2$

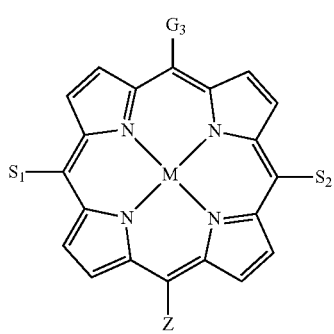

$P_3$

13. The conjugated polymer compound of any one of Embodiments 9-12, wherein $G_3$ is π; M is one of $Zn^{2+}$ and $2H^+$; and each of $S_1$ and $S_2$ is selected from one of a straight-chain saturated $C_{1-30}$ alkyl group, a branched-chain saturated $C_{1-30}$ alkyl group, and an aryl group, and the aryl group has a phenyl group, wherein the phenyl group includes at least a substituent, and the substituent is one selected from a group consisting of a hydrogen, a halogen, an alkyl halide, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group.

14. The conjugated polymer compound of any one of Embodiments 9-13, wherein each of the $P_1$, $P_2$ and $P_3$ further includes a substituent Z, and the substituent Z is one selected from a group consisting of $Z_1$, $Z_2$, $Z_3$, $Z_4$, $Z_5$, $Z_6$, $Z_7$ and $Z_8$, wherein $Z_1$, $Z_2$, $Z_3$, $Z_4$, $Z_5$, $Z_6$, $Z_7$ and $Z_8$ are shown as follows.

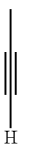

$Z_1$

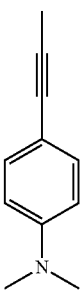

$Z_2$

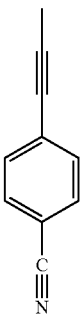

$Z_3$

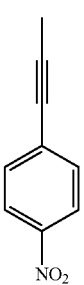

$Z_4$

-continued

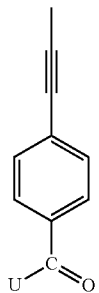

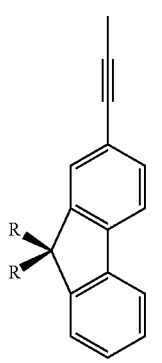

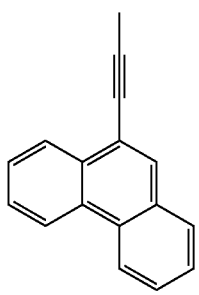

-continued

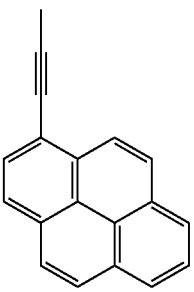

15. The conjugated polymer compound of any one of Embodiments 9-14, wherein the conjugated polymeric main chain determines the absorption in a red light region of solar radiation; the side chain determines the absorption in a blue light region of solar radiation; and the conjugated polymer compound is a p-type polymeric material being an electron donor to be mixed with an electron acceptor in a specific ratio to form an active layer material disposed in an organic thin film solar cell.

16. The conjugated polymer compound of any one of Embodiments 9-15, wherein the electron acceptor is a fullerene derivative, and the fullerene derivative is one of $PC_{61}BM$ and $PC_{71}BM$; and the conjugated polymer compound and the fullerene derivative are mixed in the specific ratio, wherein the specific ratio is a weight percentage, the specific ratio of the conjugated polymer compound to the fullerene derivative is 1 to a specific value, and the specific value ranges from 0.8 to 1.3.

17. A conjugated polymer compound, comprising a main chain and a side chain, wherein the side chain includes a porphyrin compound.

18. The conjugated polymer compound of Embodiment 17, wherein the main chain includes n heterocyclic aromatic compounds, and the conjugated polymer compound has the structure (A).

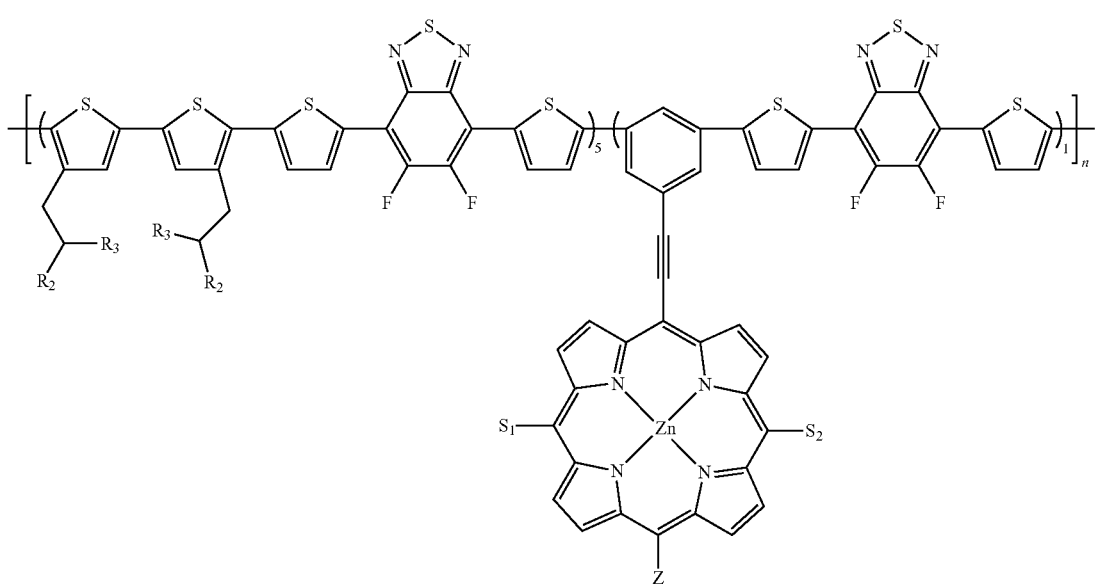

(A)

19. The conjugated polymer compound of any one of Embodiments 17-18, wherein n ranges from 1 to 100.

20. The conjugated polymer compound of any one of Embodiments 17-19, wherein $R_2$ is a straight-chain saturated $C_8$ alkyl group and $R_3$ is a straight-chain saturated $C_{10}$ alkyl group; each of $S_1$ and $S_2$ is one of a straight-chain and branched-chain saturated $C_{1-30}$ alkyl group and an aryl group, and the aryl group has a phenyl group, wherein the phenyl group includes at least a substituent and the substituent is one selected from a group consisting of a hydrogen, a halogen, an alkyl halide, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group; wherein each of $S_1$ and $S_2$ is 1,3-bis(dodecyloxy)benzene; and Z is one selected from a group consisting of $Z_1$, $Z_2$, $Z_3$, $Z_4$, $Z_5$, $Z_6$, $Z_7$ and $Z_8$, wherein $Z_1$, $Z_2$, $Z_3$, $Z_4$, $Z_5$, $Z_6$, $Z_7$ and $Z_8$ are shown as follows.

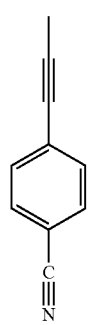

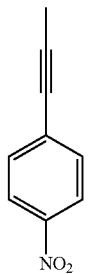

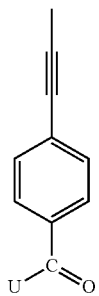

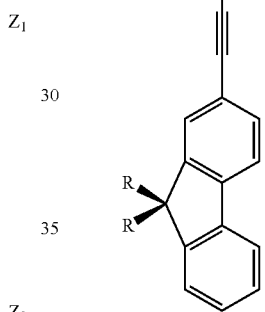

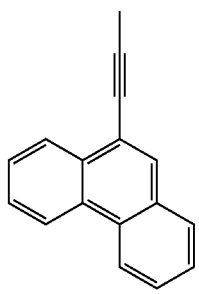

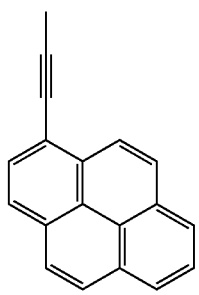

In summary, the introduced porphyrin compound can simultaneously increase the solubility of the conjugated polymer material and improve the morphology and the stability of the active layer as well. The conjugated polymer compound containing the porphyrin compound is a light-sensitive material, which has good solubility in solvents, such as tetrahydrofuran, toluene, chlorobenzene, dichlorobenzene and so on, frequently used in the general process of manufacturing polymer solar cells. In addition, it is not necessary to use additional sophisticated solvent treatments or thermal treatments on the active layer to optimize the morphology of the active layer. Therefore, it is beneficial for the mass production process with large substrate areas or an ink jet printing process. Due to the fact that the obtained active layer has high stability, the polymer solar cell manufactured with this process, even when maintained in an unpackaged state and exposed to the air for over 600 hours, retains its optoelectronic conversion efficiency of 90% or above. As a result, the present invention provides a light-sensitive material with a conjugating polymer compound containing a porphyrin compound which has absorption of the full region of the solar spectrum. The material is easily processed and is applicable for the production of polymer solar cells with high efficiency and high stability.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A conjugated polymer compound having one of the formula (1) and (2),

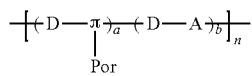
(1)

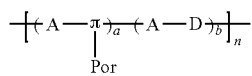
(2)

wherein each of A and D is one selected from a group consisting of an unsaturated 5-membered heterocyclic ring, an unsaturated 6-membered heterocyclic ring, an unsaturated 5-membered heteroaromatic ring and an unsaturated 6-membered heteroaromatic ring, each of a and b ranges from 1 to 20, n ranges from 1 to 100, the Por is a porphyrin compound, and $\pi$ is selected from one of an unsaturated $C_{3-16}$ aromatic ring and an unsaturated $C_{3-16}$ heteroaromatic ring, wherein the unsaturated $C_{3-16}$ heteroaromatic ring includes at least a heteroatom, and the heteroatom includes at least one selected from a group consisting of N, S, O, and Se.

2. The conjugated polymer compound according to claim 1, wherein the unsaturated $C_{3-16}$ heteroaromatic ring further includes $N_{1-3}$.

3. The conjugated polymer compound according to claim 1, wherein the porphyrin compound is one selected from a group consisting of $P_1$, $P_2$ and $P_3$, wherein $P_1$, $P_2$ and $P_3$ are shown as follows,

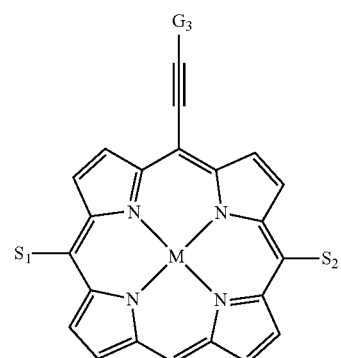
$P_1$

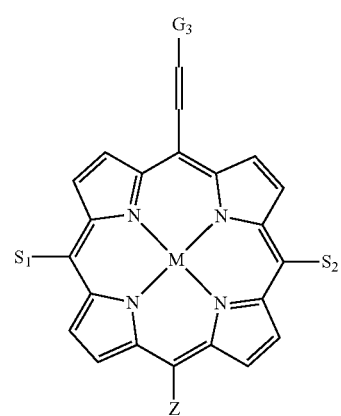
$P_2$

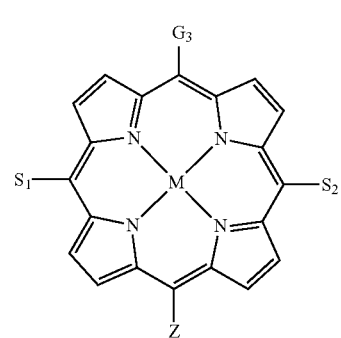
$P_3$ $G_3$ is $\pi$;

M is one of $Zn^{2+}$ and $2H^+$;

each of $S_1$ and $S_2$ is one selected from a group consisting of a straight-chain saturated $C_{1-30}$ alkyl group, a branched-chain saturated $C_{1-30}$ alkyl group, and an aryl group, and the aryl group has a phenyl group, wherein the phenyl group includes at least a substituent, the substituent is one selected from a group consisting of a hydrogen, a halogen, an alkyl halide group, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group;

Z is one selected from a group consisting of $Z_1$, $Z_2$, $Z_3$, $Z_4$, $Z_5$, $Z_6$, $Z_7$ and $Z_8$, wherein $Z_1$, $Z_2$, $Z_3$, $Z_4$, $Z_5$, $Z_6$, $Z_7$ and $Z_8$ are shown as follows;

$Z_1$

$Z_2$
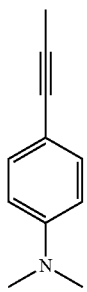

$Z_3$
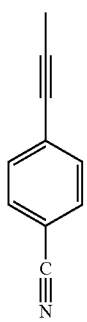

$Z_4$
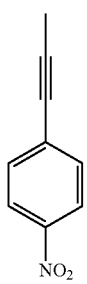

$Z_5$
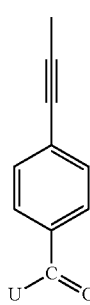

-continued

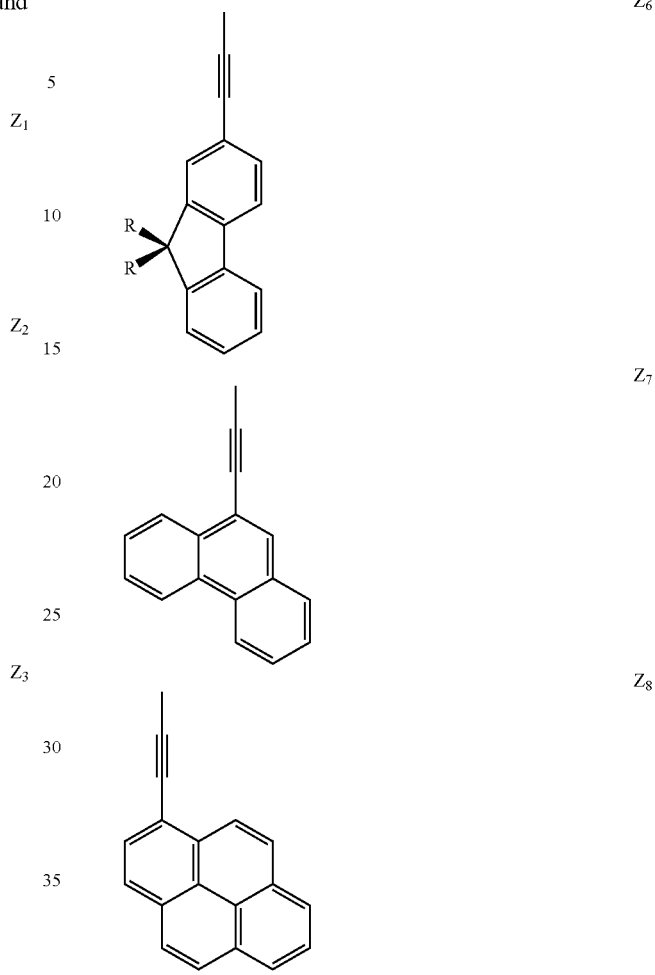

and

R is one of hydrogen, a straight-chain saturated $C_{1-30}$ alkyl group and a $C_{6-16}$ aryl group.

4. The conjugated polymer compound according to claim 3, wherein

M is $Zn^{2+}$.

5. The conjugated polymer compound according to claim 4, wherein R is one selected from a group consisting of a hydrogen, a straight-chain saturated $C_{1-30}$ alkyl group, a branched-chain saturated $C_{1-30}$ alkyl group, and a $C_{6-16}$ aryl group; and U is one selected from a group consisting of OR, chlorine, bromine, and iodine.

6. The conjugated polymer compound according to claim 1, wherein D is one selected from a group consisting of $D_1$, $D_2$, $D_3$, $D_4$, $D_5$, and $D_6$, and $D_1$, $D_2$, $D_3$, $D_4$, $D_5$, and $D_6$ are shown as follows; and $D_1$
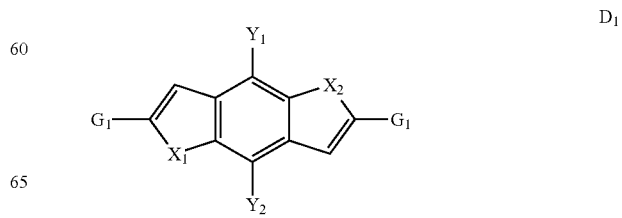

-continued

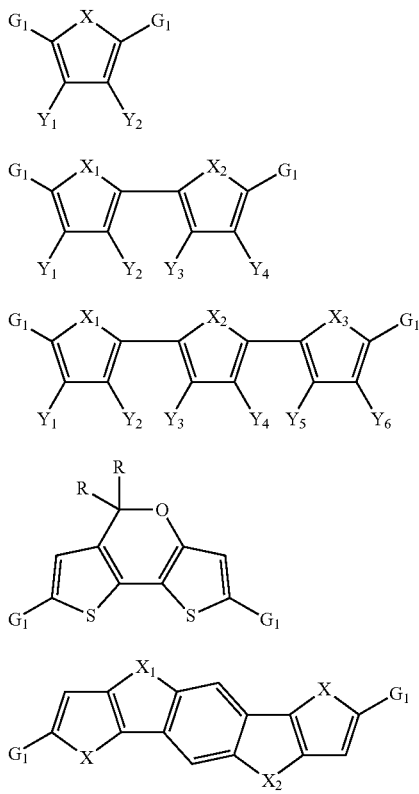

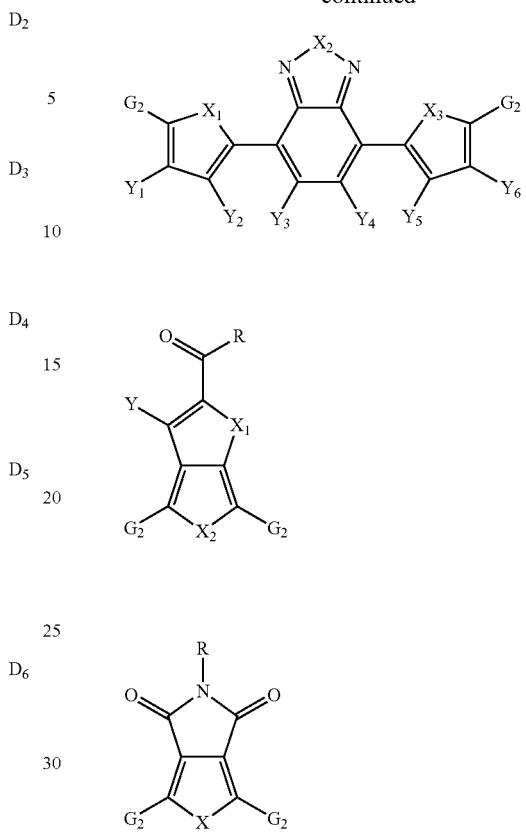

wherein $G_1$ is one of $\pi$ and A;

$G_2$ is one of $\pi$ and D;

each of X and $X_{1-3}$ is one selected from a group consisting of O, S, Se, Te, NQ, $CQ_2$, $SiQ_2$, $GeQ_2$ and $SnQ_2$, wherein Q is one of hydrogen, a straight-chain saturated $C_{1-30}$ alkyl group and a $C_{6-16}$ aryl group;

each of Y and $Y_{1-12}$ is one selected from a group consisting of a hydrogen, a halogen, an alkyl halide, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group, and A is one selected from a group consisting of $A_1$, $A_2$, $A_3$, $A_4$, $A_5$, $A_6$, $A_7$, $A_8$, $A_9$, and $A_{10}$, and $A_1$, $A_2$, $A_3$, $A_4$, $A_5$, $A_6$, $A_7$, $A_8$, $A_9$, and $A_{10}$, are shown as follows

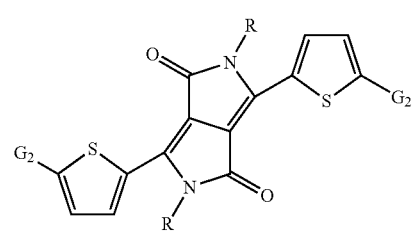

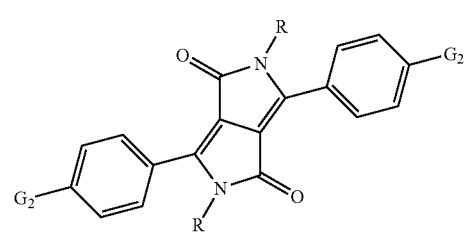

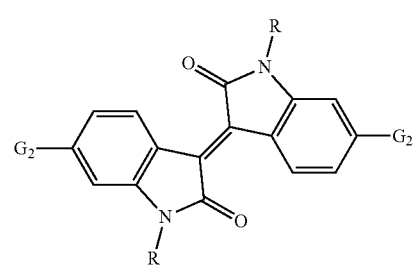

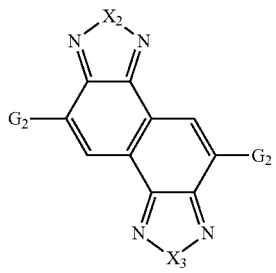

A8

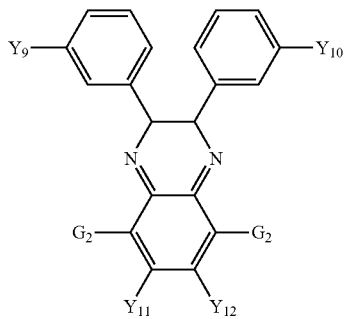

A9

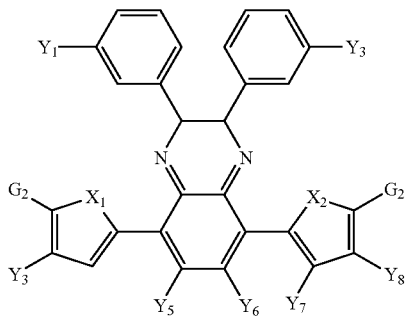

A10

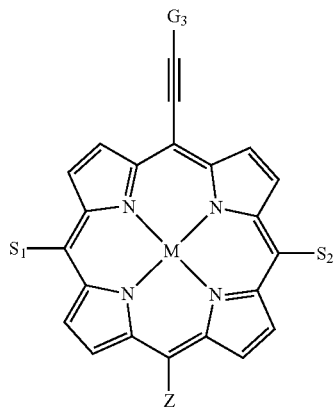

P1

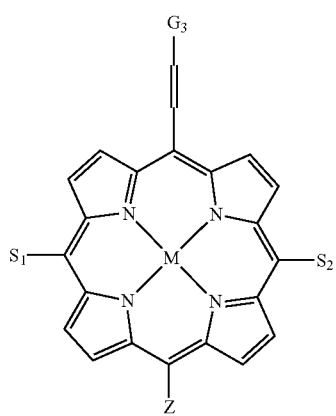

P2

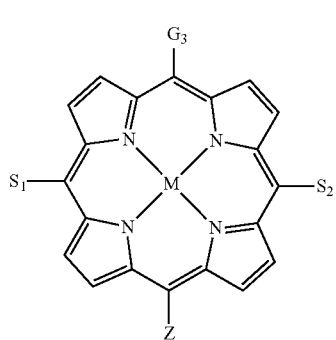

P3

7. The conjugated polymer compound according to claim 6, wherein the halogen is one of fluorine and chlorine; and
   the alkyl halide is one selected from a group consisting of a trifluoromethyl, a trichloromethyl, a tribromomethyl, and a triiodomethyl.

8. A conjugated polymer compound, comprising:
   a conjugated polymeric main chain; and
   a porphyrin compound having an absorption in a blue light region of solar radiation, and is bonded to the polymeric main chain to form a side chain on the polymeric main chain,
   wherein the porphyrin compound is a macro molecular heterocyclic compound and is one selected from a group consisting of $P_1$, $P_2$ and $P_3$, wherein $P_1$, $P_2$ and $P_3$ are shown as follows;

M is one of $Zn^{2+}$ and $2H^+$;

$G_3$ is $\pi$;

each of $S_1$ and $S_2$ is one selected from a group consisting of a straight-chain saturated $C_{1-30}$ alkyl group, a branched-chain saturated $C_{1-30}$ alkyl group and an aryl group; and Z is one selected from a group consisting of $Z_1$, $Z_2$, $Z_3$, $Z_4$, $Z_5$, $Z_6$, $Z_7$ and $Z_8$, wherein $Z_1$, $Z_2$, $Z_3$, $Z_4$, $Z_5$, $Z_6$, $Z_7$ and $Z_8$ are shown as follows

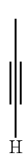

$Z_1$

Z₂ 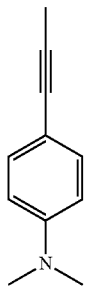

Z₃ 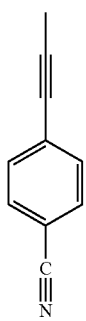

Z₄ 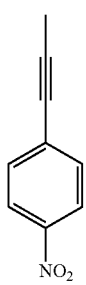

Z₅ 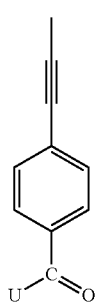

Z₆ 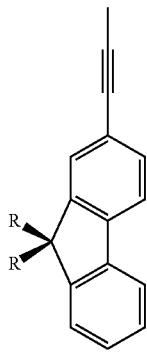

Z₇ 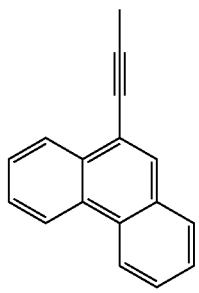

Z₈ 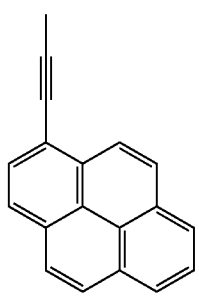

9. The conjugated polymer compound according to claim 8, wherein the conjugated polymeric main chain includes:
  a π aromatic group selected from a group consisting of a $C_{3-6}$ aromatic hydrocarbon, an unsaturated $C_{3-6}$ heteroaromatic ring and a polycyclic aromatic hydrocarbon; and
  a plurality of electron withdrawing/donating groups including at least a derivative of one selected from a group consisting of furan, thiophene, selenophene, tellurophene, pyrrole, cyclopentene, silole, germole, stannole, oxadiaxole, thiadiazole, selenadiazole, triazole, diazole, pyran, pyrrole, pyrazine and a combination thereof.

10. The conjugated polymer compound according to claim 9, wherein the unsaturated $C_{3-6}$ heteroaromatic ring includes at least a heteroatom, and the heteroatom includes at least one selected from a group consisting of N, S, O, and Se;
  the unsaturated $C_{3-6}$ heteroaromatic ring further includes $N_{1-3}$; and
  the polycyclic aromatic hydrocarbon is one of naphthalene and anthracene.

11. The conjugated polymer compound according to claim 8, wherein the porphyrin compound is $P_1$.

12. The conjugated polymer compound according to Claim 8, wherein the aryl group has a phenyl group, wherein the phenyl group includes at least a substituent, and the substituent is one selected from a group consisting of a hydrogen, a halogen, an alkyl halide, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group.

13. The conjugated polymer compound according to claim 8, wherein the conjugated polymeric main chain determines the absorption in a red light region of solar radiation;
the side chain determines the absorption in a blue light region of solar radiation; and
the conjugated polymer compound is a p-type polymeric material being an electron donor to be mixed with an electron acceptor to form an active layer material disposed in an organic thin film solar cell.

14. The conjugated polymer compound according to claim 13,
wherein
the electron acceptor is a fullerene derivative, and the fullerene derivative is one of $PC_{61}BM$ and $PC_{71}BM$; and
the conjugated polymer compound and the fullerene derivative are mixed in a specific ratio, wherein the specific ratio is a weight percentage, the specific ratio of the conjugated polymer compound to the fullerene derivative is 1 to a specific value, and the specific value ranges from 0.8 to 1.3.

15. A conjugated polymer compound, comprising a main chain and a side chain, wherein the side chain includes a porphyrin compound, and the conjugated polymer compound has the structure (A),

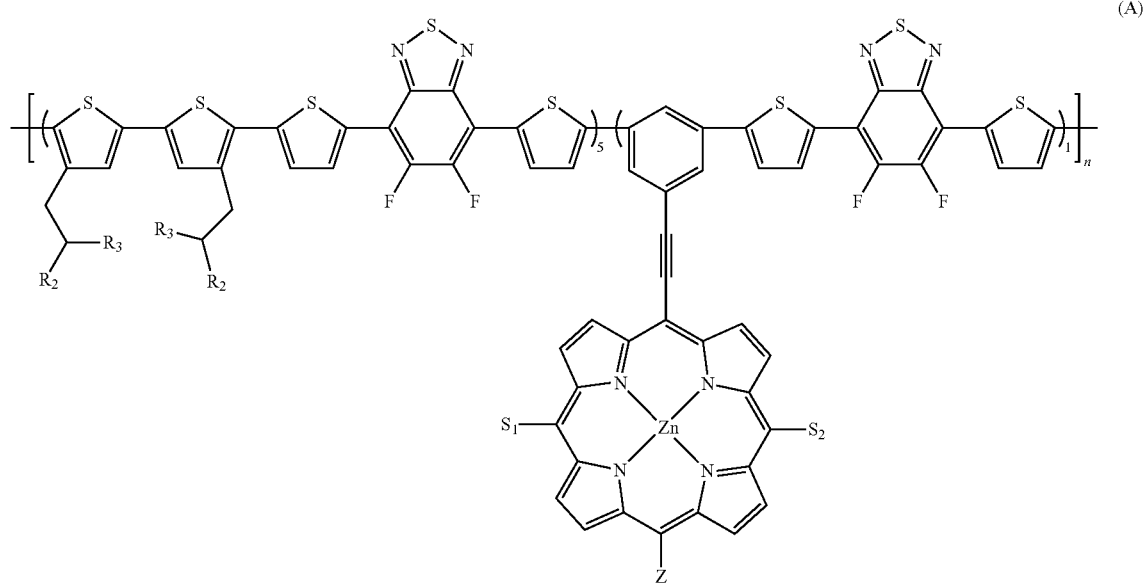

(A)

n ranges from 1 to 100;

$R_2$ is a straight-chain saturated $C_8$ alkyl group and $R_3$ is a straight-chain saturated $C_{10}$ alkyl group;

each of $S_1$ and $S_2$ is one selected from a group consisting of straight-chain and branched-chain saturated $C_{1-30}$ alkyl groups and an aryl group, and the aryl group has a phenyl group, wherein the phenyl group includes at least a substituent and the substituent is one selected from a group consisting of a hydrogen, a halogen, an alkyl halide, a cyano, a straight-chain saturated $C_{1-30}$ alkyl group, a branched-chain saturated $C_{1-30}$ alkyl group, a straight-chain saturated $C_{1-30}$ alkoxy group, a branched-chain saturated $C_{1-30}$ alkoxy group, a straight-chain saturated $C_{1-30}$ alkylthio group, a branched-chain saturated $C_{1-30}$ alkylthio group, a straight-chain saturated $C_{1-30}$ ester group, a branched-chain saturated $C_{1-30}$ ester group, a straight-chain saturated $C_{1-30}$ acetyl group, and a branched-chain saturated $C_{1-30}$ acetyl group, wherein each of $S_1$ and $S_2$ is 1,3-bis(dodecyloxy)benzene; and Z is one selected from a group consisting of $Z_1$, $Z_2$, $Z_3$, $Z_4$, $Z_5$, $Z_6$, $Z_7$ and $Z_8$, wherein $Z_1$, $Z_2$, $Z_3$, $Z_4$, $Z_5$, $Z_6$, $Z_7$ and $Z_8$ are shown as follows

$Z_1$

-continued

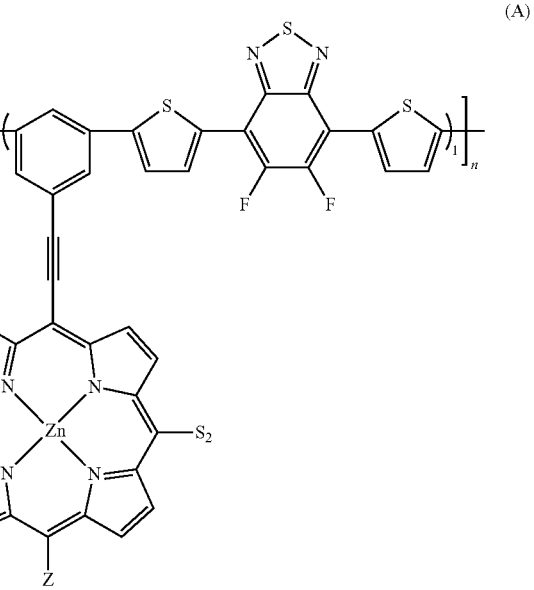

$Z_2$

-continued
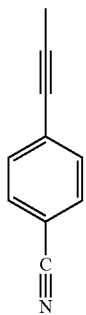
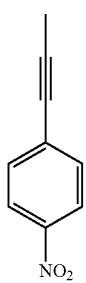
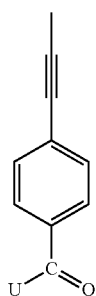
$Z_3$
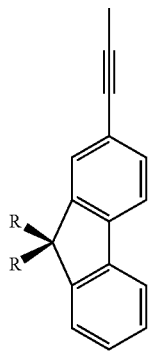
$Z_4$
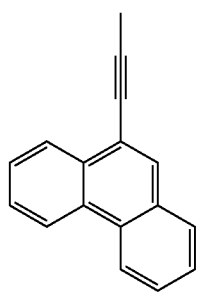
$Z_5$
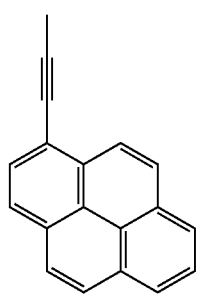
$Z_6$
$Z_7$
$Z_8$
* * * * *